(12) United States Patent
Oh et al.

(10) Patent No.: US 10,084,005 B2
(45) Date of Patent: Sep. 25, 2018

(54) SHARED PIXEL AND AN IMAGE SENSOR INCLUDING THE SAME

(71) Applicant: SAMSUNG ELECTRONICS CO., LTD., Suwon-si, Gyeonggi-Do (KR)

(72) Inventors: Min-Seok Oh, Osan-si (KR); Sang-Joo Lee, Seongnam-si (KR); Tae-Hoon Kim, Daejeon (KR); Moo-Sup Lim, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 72 days.

(21) Appl. No.: 15/239,990

(22) Filed: Aug. 18, 2016

(65) Prior Publication Data

US 2017/0053962 A1   Feb. 23, 2017

(30) Foreign Application Priority Data

Aug. 21, 2015 (KR) ........................ 10-2015-0118253

(51) Int. Cl.
*H01L 27/146* (2006.01)
*H01L 31/0288* (2006.01)

(52) U.S. Cl.
CPC .... *H01L 27/14641* (2013.01); *H01L 27/1461* (2013.01); *H01L 27/1463* (2013.01); *H01L 27/14603* (2013.01); *H01L 27/14609* (2013.01); *H01L 27/14614* (2013.01);
(Continued)

(58) Field of Classification Search
CPC .. H01L 27/14641; H01L 27/14609–27/14616; H01L 27/14638; H01L 27/14887; H01L 27/14654–27/14656; H01L 27/14672–27/14674; H01L 27/1463; H01L 27/1461; H01L 27/14607; H01L 31/0288; H01L 27/14603; H01L 27/14643
See application file for complete search history.

(56) References Cited

U.S. PATENT DOCUMENTS

| | | | |
|---|---|---|---|
| 7,755,116 | B2 | 7/2010 | Toros et al. |
| 7,990,444 | B2 | 8/2011 | Kudoh |
| 8,138,462 | B2 | 3/2012 | Altice, Jr. et al. |

(Continued)

FOREIGN PATENT DOCUMENTS

| | | |
|---|---|---|
| JP | 2011-182360 | 9/2011 |
| KR | 10-1246141 | 3/2013 |

*Primary Examiner* — Marvin Payen
*Assistant Examiner* — Jeremy Joy
(74) *Attorney, Agent, or Firm* — F. Chau & Associates, LLC

(57) ABSTRACT

A shared pixel includes a plurality of photo diode regions, a shared floating diffusion region, a plurality of transfer gates and a blooming layer. Each of the photo diode regions generates photo-charges in response to incident light. The photo diode regions are formed in a semiconductor substrate. The shared floating diffusion region is shared by the plurality of photo diode regions. The shared floating diffusion region is separated from the plurality of photo diode regions in the semiconductor substrate. Each of the transfer gates transfers the photo-charges of a corresponding photo diode region to the shared floating diffusion region in response to a transfer control signal. The blooming layer transfers overflow photo-charges to a power supply voltage node.

19 Claims, 17 Drawing Sheets

(52) U.S. Cl.
CPC .. *H01L 27/14643* (2013.01); *H01L 27/14654* (2013.01); *H01L 27/14656* (2013.01); *H01L 31/0288* (2013.01)

(56) References Cited

U.S. PATENT DOCUMENTS

| | | | |
|---|---|---|---|
| 8,614,759 B2 | 12/2013 | Watanabe et al. | |
| 8,692,303 B2 * | 4/2014 | Ohri | H01L 27/1461 257/292 |
| 8,710,420 B2 | 4/2014 | Hynecek | |
| 8,785,986 B1 | 7/2014 | Hynecek et al. | |
| 8,928,792 B1 | 1/2015 | Hynecek et al. | |
| 8,946,795 B2 | 2/2015 | Chen et al. | |
| 2001/0004116 A1 * | 6/2001 | Tsunai | H01L 27/14603 257/223 |
| 2004/0141076 A1 * | 7/2004 | Ueno | H01L 27/14609 348/301 |
| 2006/0284222 A1 * | 12/2006 | Hong | H01L 27/14603 257/292 |
| 2007/0040922 A1 * | 2/2007 | McKee | H01L 27/14609 348/308 |
| 2007/0045668 A1 | 3/2007 | Brady et al. | |
| 2007/0052055 A1 * | 3/2007 | McKee | H01L 27/14603 257/462 |
| 2009/0213256 A1 * | 8/2009 | Kudoh | H01L 27/14603 348/302 |
| 2010/0134648 A1 * | 6/2010 | Funatsu | H01L 27/14609 348/222.1 |
| 2011/0019038 A1 * | 1/2011 | Okuno | H01L 27/14609 348/246 |
| 2011/0139963 A1 * | 6/2011 | Krymski | H01L 27/14689 250/208.1 |
| 2013/0235243 A1 * | 9/2013 | Sano | H04N 5/374 348/308 |
| 2014/0054662 A1 * | 2/2014 | Yanagita | H01L 27/1463 257/291 |
| 2014/0118593 A1 * | 5/2014 | Wakano | H01L 27/14609 348/308 |
| 2014/0367552 A1 * | 12/2014 | Hynecek | H01L 27/14614 250/208.1 |
| 2015/0048466 A1 | 2/2015 | Wu et al. | |
| 2015/0288940 A1 * | 10/2015 | Chiu | H04N 9/735 348/241 |
| 2017/0294475 A1 * | 10/2017 | Yamakawa | H01L 27/14643 |

* cited by examiner

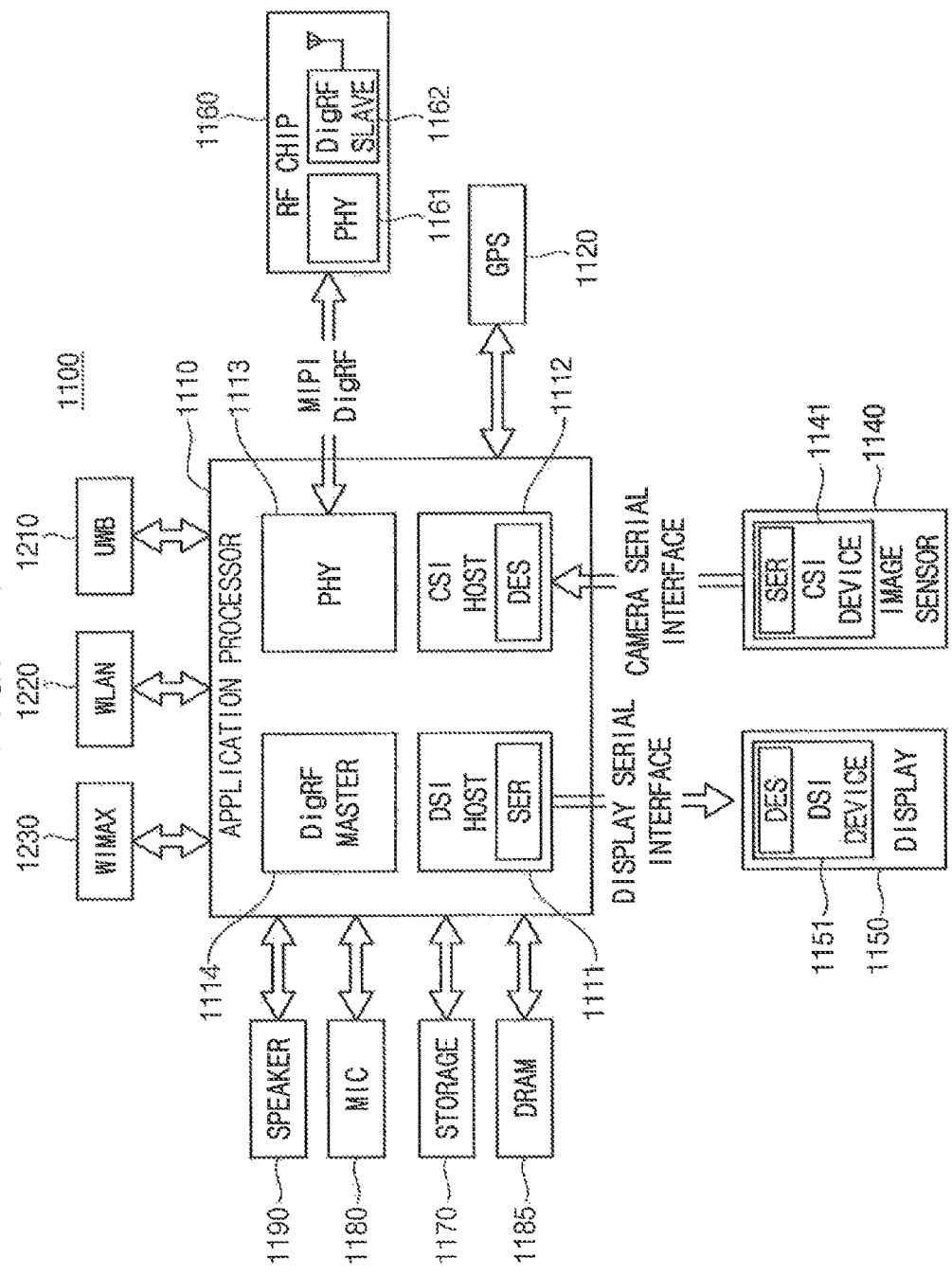

SHARED PIXEL AND AN IMAGE SENSOR INCLUDING THE SAME

CROSS-REFERENCE TO RELATED APPLICATION

This U.S. non-provisional patent application claims priority under 35 U.S.C. § 119 to Korean Patent Application No. 10-2015-0118253, filed on Aug. 21, 2015, in the Korean Intellectual Property Office (KIPO), the disclosure of which is incorporated by reference herein in its entirety.

TECHNICAL FIELD

Exemplary embodiments of the inventive concept relate to a semiconductor device and more particularly to a shared pixel and an image sensor including the shared pixel.

DESCRIPTION OF THE RELATED ART

An image sensor is a device that converts an optical image into an electronic signal. It is used mostly in digital cameras, camera modules and other imaging devices. Due to the development of manufacturing techniques for semiconductor devices, an image sensor is being made with higher performance and higher speed. For an image sensor with even higher performance and higher speed, various research is in progress.

SUMMARY

According to an exemplary embodiment of the inventive concept, a shared pixel includes a plurality of photo diode regions, a shared floating diffusion region, a plurality of transfer gates and a first blooming layer. Each of the plurality of photo diode regions generates photo-charges in response to incident light. The plurality of photo diode regions are formed in a semiconductor substrate. The shared floating diffusion region is shared by the plurality of photo diode regions. The shared floating diffusion region is separated from the plurality of photo diode regions in the semiconductor substrate. Each of the plurality of transfer gates transfers the photo-charges of a corresponding photo diode region to the shared floating diffusion region in response to a transfer control signal. The first blooming layer transfers overflow photo-charges to a power supply voltage node, wherein a number of the overflow photo-charges is a difference between a number of the photo-charges generated by one of the photo diode regions and a reference photo-charge number.

A potential of a blooming barrier between one of the photo diode regions and the power supply voltage node may be less than a potential of a transfer barrier between the one of the photo diode regions and the shared floating diffusion region.

The potential of the blooming barrier may be based on a material included in the first blooming layer.

The first blooming layer may include a well region that is doped with an n-type material in the semiconductor substrate between the plurality of photo diode regions and the power supply voltage node, and the n-type material includes arsenic (As) or phosphorus (P).

The potential of the blooming barrier may be based on a distance between one of the photo diode regions and the power supply voltage node.

The shared pixel may further include a second blooming layer formed on the first blooming layer. The potential of the blooming barrier may be decreased by the second blooming layer.

The overflow photo-charges that are generated in a first group region of the photo diode regions may be transferred to a first power supply voltage node. The first blooming layer may be formed between the first group region and the first power supply voltage node.

The overflow photo-charges that are generated in a second group region of the photo diode regions may be transferred to a second power supply voltage node that is different from the first power supply voltage node. A second blooming layer may be formed between the second group region and the second power supply voltage node.

The second power supply voltage node may be included in another shared pixel adjacent to the shared pixel.

The shared pixel may include four or eight photo diode regions.

The shared pixel may include a shallow trench isolation free (STI-free) structure.

The shared pixel may include a partial shallow trench isolation free (partial STI-free) structure.

According to an exemplary embodiment of the inventive concept, an image sensor includes a pixel array and a signal processor. The pixel array generates a plurality of pixel signals in response to incident light. The pixel array includes a plurality of shared pixels. The signal processor generates image data in response to the pixel signals. At least one of the shared pixels includes a plurality of photo diode regions, a shared floating diffusion region, a plurality of transfer gates and a blooming layer. Each of the plurality of photo diode regions generates photo-charges in response to the incident light. The plurality of photo diode regions are formed in a semiconductor substrate. The shared floating diffusion region is shared by the plurality of photo diode regions. The shared floating diffusion region is separated from the plurality of photo diode regions in the semiconductor substrate. Each of the plurality of transfer gates transfers the photo-charges to the shared floating diffusion region in response to a transfer control signal. The blooming layer transfers overflow photo-charges to a power supply voltage node, wherein a number of the overflow photo-charges is a difference between a number of the photo-charges generated by one of the photo diode regions and a reference photo-charge number.

A potential of a blooming barrier between one of the photo diode regions and the power supply voltage node may be less than a potential of a transfer barrier between the one of the photo diode regions and the shared floating diffusion region.

The potential of the blooming barrier may be based on an n-type material included in the blooming layer.

According to an exemplary embodiment of the inventive concept, a pixel includes: a plurality of photo diodes; a floating diffusion region; a plurality of transfer gates configured to transfer photo charges of the photo diodes to the floating diffusion region; and a blooming layer configured to transfer overflow photo charges to a power supply voltage node.

A first transfer transistor transfers photo charges of a first photo diode to the floating diffusion region via a first transfer path and overflow photo charges of the first photo diode are transferred to the power supply voltage node via a first blooming path.

The power supply voltage node is connected between the first transfer transistor and a drive transistor.

The power supply voltage node includes a n+ material.

The floating diffusion region is separated from the photo diodes in a semiconductor substrate.

BRIEF DESCRIPTION OF THE DRAWINGS

The above and other features of the inventive concept will become more clearly understood by describing in detail exemplary embodiments thereof with reference to the accompanying drawings.

FIG. 19 is a block diagram illustrating a computing system including an image sensor according to an exemplary embodiment of the inventive concept.

DETAILED DESCRIPTION OF THE EMBODIMENTS

Figure 1:
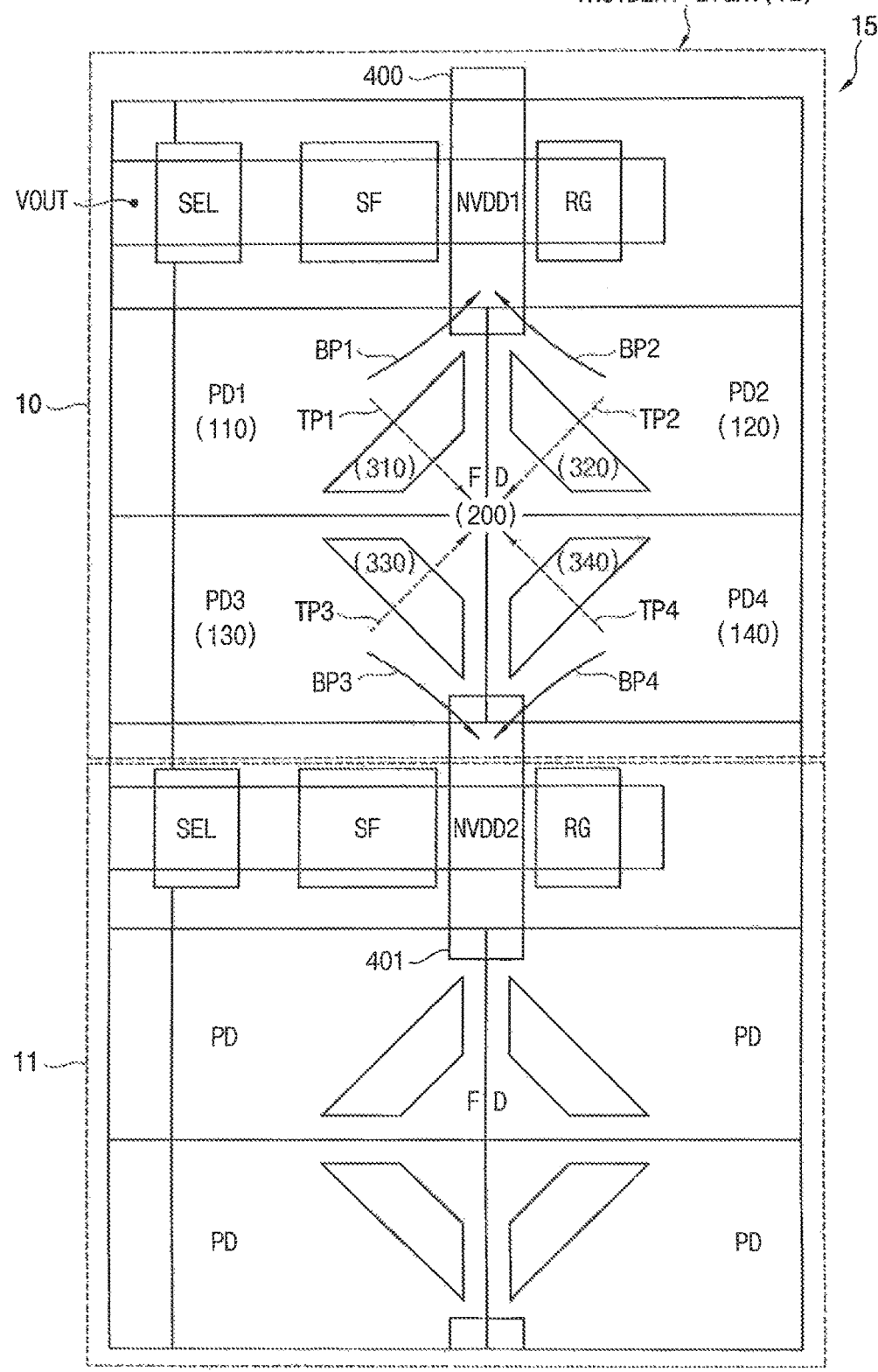
FIG. 1 is a diagram illustrating a shared pixel according to an exemplary embodiment of the inventive concept.

Exemplary embodiments of the inventive concept will be described more fully hereinafter with reference to the accompanying drawings. The inventive concept may, however, be embodied in many different forms and should not be construed as limited to the exemplary embodiments set forth herein. In the drawings, the sizes and relative sizes of layers and regions may be exaggerated for clarity. Like numerals may refer to like elements throughout this application.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Figure 2:
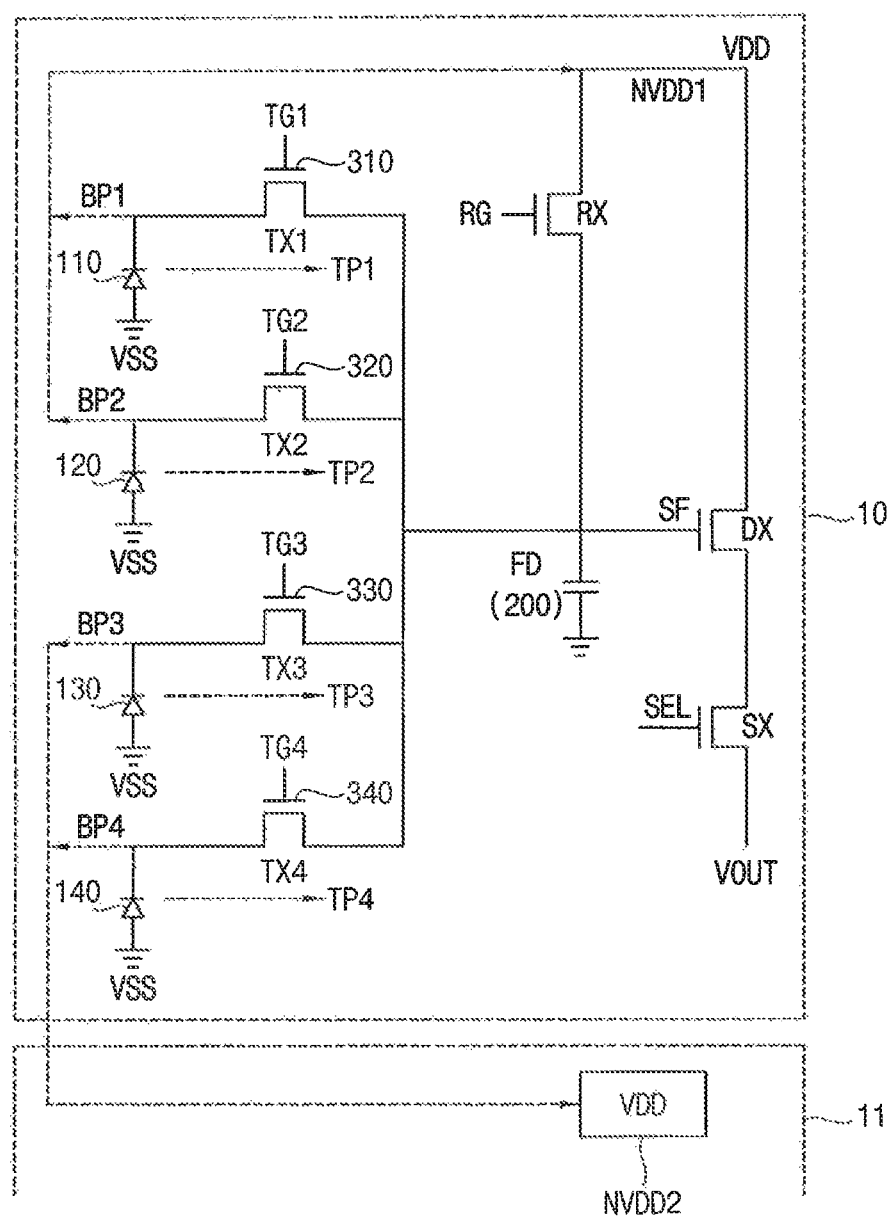
FIG. 2 is a circuit diagram illustrating the shared pixel of FIG. 1 according to an exemplary embodiment of the inventive concept.

FIG. 1 is a diagram illustrating a shared pixel according to an exemplary embodiment of the inventive concept and FIG. 2 is a circuit diagram illustrating the shared pixel of FIG. 1 according to an exemplary embodiment of the inventive concept.

Referring to FIGS. 1 and 2, a shared pixel 10 includes a plurality of photo diode regions 110 (PD1), 120 (PD2), 130 (PD3), 140 (PD4), a shared floating diffusion region 200 (FD), a plurality of transfer gates 310, 320, 330, 340 and a blooming layer 400. The plurality of photo diode regions 110, 120, 130, 140 generates photo-charges PC based on incident light IL. The plurality of photo diode regions 110, 120, 130, 140 is formed in a semiconductor substrate 15.

For example, the photo diode regions 110, 120, 130, 140 may include a first photo diode region 110, a second photo diode region 120, a third photo diode region 130 and a fourth photo diode region 140. The first photo diode region 110 may correspond to a blue color, the second photo diode region 120 and the third photo diode region 130 may correspond to a green color and the fourth photo diode region 140 may correspond to a red color. The first photo diode region 110 may generate photo-charges PC corresponding to the blue color based on incident light IL. The second photo diode region 120 and the third photo diode region 130 may generate photo-charges PC corresponding to the green color based on incident light IL. In addition, the fourth photo diode region 140 may generate photo-charges PC corresponding to the red color based on incident light IL. The first to fourth photo diode regions 110 to 140 include photo diodes.

The shared floating diffusion region 200 is shared among the plurality of photo diode regions 110, 120, 130, 140. The shared floating diffusion region 200 is separated from the plurality of photo diode regions 110, 120, 130, 140 in the semiconductor substrate 15. The plurality of transfer gates 310, 320, 330, 340 transfer the photo-charges PC to the shared floating diffusion region 200 based on a transfer control signal TG.

For example, when a first transfer control signal TG1 is a first logic level, a first transfer transistor TX1 may be turned-on. The first logic level may be a logic high level. When the first transfer transistor TX1 is turned-on, the photo-charges PC stored in the first photo diode region 110 may be transferred to the shared floating diffusion region 200 through a first transfer path TP1. When the photo-charges PC stored in the first photo diode region 110 are transferred to the shared floating diffusion region 200 through the first transfer path TP1, a drive transistor DX may be turned-on based on a source follow signal SF. In addition, when a selection control signal SEL is the first logic level, a selection transistor SX may be turned-on. When the drive transistor DX is turned-on based on the source follow signal SF and the selection transistor SX is turned-on based on the selection control signal SEL, the shared pixel 10 may provide an output signal VOUT corresponding to the photo-charges PC stored in the first photo diode region 110.

For example, when a second transfer control signal TG2 is the first logic level, a second transfer transistor TX2 may be turned-on. When the second transfer transistor TX2 is turned-on, the photo-charges PC stored in the second photo diode region 120 may be transferred to the shared floating diffusion region 200 through a second transfer path TP2. When the photo-charges PC stored in the second photo diode region 120 are transferred to the shared floating diffusion region 200 through the second transfer path TP2, the drive transistor DX may be turned-on based on the source follow signal SF. In addition, when the selection control signal SEL is the first logic level, the selection transistor SX may be turned-on. When the drive transistor DX is turned-on based on the source follow signal SF and the selection transistor SX is turned-on based on the selection control signal SEL, the shared pixel 10 may provide the output signal VOUT corresponding to the photo-charges PC stored in the second photo diode region 120.

For example, when a third transfer control signal TG3 is the first logic level, a third transfer transistor TX3 may be turned-on. When the third transfer transistor TX3 is turned-on, the photo-charges PC stored in the third photo diode region 130 may be transferred to the shared floating diffusion region 200 through a third transfer path TP3. When the photo-charges PC stored in the third photo diode region 130 are transferred to the shared floating diffusion region 200 through the third transfer path TP3, the drive transistor DX may be turned-on based on the source follow signal SF. In addition, when the selection control signal SEL is the first logic level, the selection transistor SX may be turned-on. When the drive transistor DX is turned-on based on the source follow signal SF and the selection transistor SX is turned-on based on the selection control signal SEL, the shared pixel 10 may provide the output signal VOUT corresponding to the photo-charges PC stored in the third photo diode region 130.

For example, when a fourth transfer control signal TG4 is the first logic level, a fourth transfer transistor TX4 may be turned-on. When the fourth transfer transistor TX4 is turned-on, the photo-charges PC stored in the fourth photo diode region 140 may be transferred to the shared floating diffusion region 200 through a fourth transfer path TP4. When the photo-charges PC stored in the fourth photo diode region 140 are transferred to the shared floating diffusion region 200 through the fourth transfer path TP4, the drive transistor DX may be turned-on based on the source follow signal SF. In addition, when the selection control signal SEL is the first logic level, the selection transistor SX may be turned-on. When the drive transistor DX is turned-on based on the source follow signal SF and the selection transistor SX is turned-on based on the selection control signal SEL, the shared pixel 10 may provide the output signal VOUT corresponding to the photo-charges PC stored in the fourth photo diode region 140.

The blooming layer 400 transfers overflow photo-charges OFPC to a power supply voltage node NVDD. The power supply voltage node NVDD may provide a power supply voltage VDD. A number of the overflow photo-charges OFPC corresponds to a difference between a number of the photo-charges PC generated in the photo diode regions 110, 120, 130, 140 and a reference photo-charge number RN. For example, the blooming layer 400 may be between the photo diode regions 110, 120, 130, 140 and the power supply voltage node NVDD. The location of the power supply voltage node NVDD may be various and may depend on the location of the transistors RX, DX and SX in a read circuit region. Transistor RX may be a reset transistor that is closed in response to signal RG and may be used to reset the floating diffusion region FD by discharging the floating diffusion region FD. As further shown in FIG. 2, VSS may be a ground voltage. In an exemplary embodiment of the inventive concept, as illustrated in FIG. 1, the power supply voltage node NVDD may be disposed near the shared floating diffusion region FD such that the blooming layer 400 may provide two blooming paths BP1 and BP2 for the two photo diode regions PD1 and PD2 sharing the floating diffusion region FD. In an exemplary embodiment of the inventive concept, the power supply voltage node NVDD move in a row direction by one pixel pitch with respect to the layout of FIG. 1 such that the blooming layer may provide two blooming paths for two photo diode regions respectively corresponding to two floating diffusion regions adjacent in the row direction.

As illustrated in FIG. 1, the blooming layer 400 may include a first blooming layer 400 providing the blooming paths BP1 and BP2 and a second blooming layer 401 proving the blooming paths BP3 and BP4, with respect to the shared pixel 10.

For example, the number of the photo-charges PC that are generated in the first photo diode region 110 may be greater than the reference photo-charge number RN. When the number of the photo-charges PC that are generated in the first photo diode region 110 is greater than the reference photo-charge number RN, the overflow photo-charges OFPC that are generated in the first photo diode region 110 may be transferred to the shared floating diffusion region 200 even though the first transfer control signal TG1 is a logic low level. The number of the overflow photo-charges OFPC that are generated in the first photo diode region 110 may be the difference between the number of the photo-charges PC that are generated in the first photo diode region 110 and the reference photo-charge number RN. To prevent the overflow photo-charges OFPC of the first photo diode region 110 from being transferred to the shared floating diffusion region 200, the first blooming layer 400 may be placed between the first photo diode region 110 and a first power supply voltage node NVDD1. When the first blooming layer 400 is placed between the first photo diode region 110 and the first power supply voltage node NVDD1, the overflow photo-charges OFPC that are generated in the first photo diode region 110 may be transferred to the first power supply voltage node NVDD1 through the first blooming path BP1.

For example, the number of the photo-charges PC that are generated in the second photo diode region 120 may be greater than the reference photo-charge number RN. When the number of the photo-charges PC that are generated in the second photo diode region 120 is greater than the reference photo-charge number RN, the overflow photo-charges OFPC that are generated in the second photo diode region 120 may be transferred to the shared floating diffusion region 200 even though the second transfer control signal TG2 is the logic low level. The number of the overflow photo-charges OFPC that are generated in the second photo diode region 120 may be the difference between the number of the photo-charges PC that are generated in the second photo diode region 120 and the reference photo-charge number RN. To prevent the overflow photo-charges OFPC of the second photo diode region 120 from being transferred to the shared floating diffusion region 200, the first blooming layer 400 may be placed between the second photo diode region 120 and the first power supply voltage node NVDD1. When the first blooming layer 400 is placed between the second photo diode region 120 and the first power supply voltage node NVDD1, the overflow photo-charges OFPC that are generated in the second photo diode region 120 may be transferred to the first power supply voltage node NVDD1 through the second blooming path BP2.

For example, the number of the photo-charges PC that are generated in the third photo diode region 130 may be greater than the reference photo-charge number RN. When the number of the photo-charges PC that are generated in the third photo diode region 130 is greater than the reference photo-charge number RN, the overflow photo-charges OFPC that are generated in the third photo diode region 130 may be transferred to the shared floating diffusion region 200 even though the third transfer control signal TG3 is the logic low level. The number of the overflow photo-charges OFPC that are generated in the third photo diode region 130 may be the difference between the number of the photo-charges PC that are generated in the third photo diode region 130 and the reference photo-charge number RN. To prevent the overflow photo-charges OFPC of the third photo diode region 130 from being transferred to the shared floating diffusion region 200, the second blooming layer 401 may be placed between the third photo diode region 130 and a second power supply voltage node NVDD2. When the second blooming layer 401 is placed between the third photo diode region 130 and the second power supply voltage node NVDD2, the overflow photo-charges OFPC that are generated in the third photo diode region 130 may be transferred to the second power supply voltage node NVDD2 through the third blooming path BP3.

For example, the number of the photo-charges PC that are generated in the fourth photo diode region 140 may be greater than the reference photo-charge number RN. When the number of the photo-charges PC that are generated in the fourth photo diode region 140 is greater than the reference photo-charge number RN, the overflow photo-charges OFPC that are generated in the fourth photo diode region 140 may be transferred to the shared floating diffusion region 200 even though the fourth transfer control signal TG4 is the logic low level. The number of the overflow photo-charges OFPC that are generated in the fourth photo diode region 140 may be the difference between the number of the photo-charges PC that are generated in the fourth photo diode region 140 and the reference photo-charge number RN. To prevent the overflow photo-charges OFPC of the fourth photo diode region 140 from being transferred to the shared floating diffusion region 200, the second blooming layer 401 may be placed between the fourth photo diode region 140 and the second power supply voltage node NVDD2. When the second blooming layer 401 is placed between the fourth photo diode region 140 and the second power supply voltage node NVDD2, the overflow photo-charges OFPC that are generated in the fourth photo diode region 140 may be transferred to the second power supply voltage node NVDD2 through the fourth blooming path BP4.

The shared pixel 10 according to an exemplary embodiment of the inventive concept may increase performance by transferring the overflow photo-charges OFPC to the power supply voltage node NVDD through the blooming layer 400 that is between the photo diode regions 110, 120, 130, 140 and the power supply voltage node NVDD.

Figure 3:
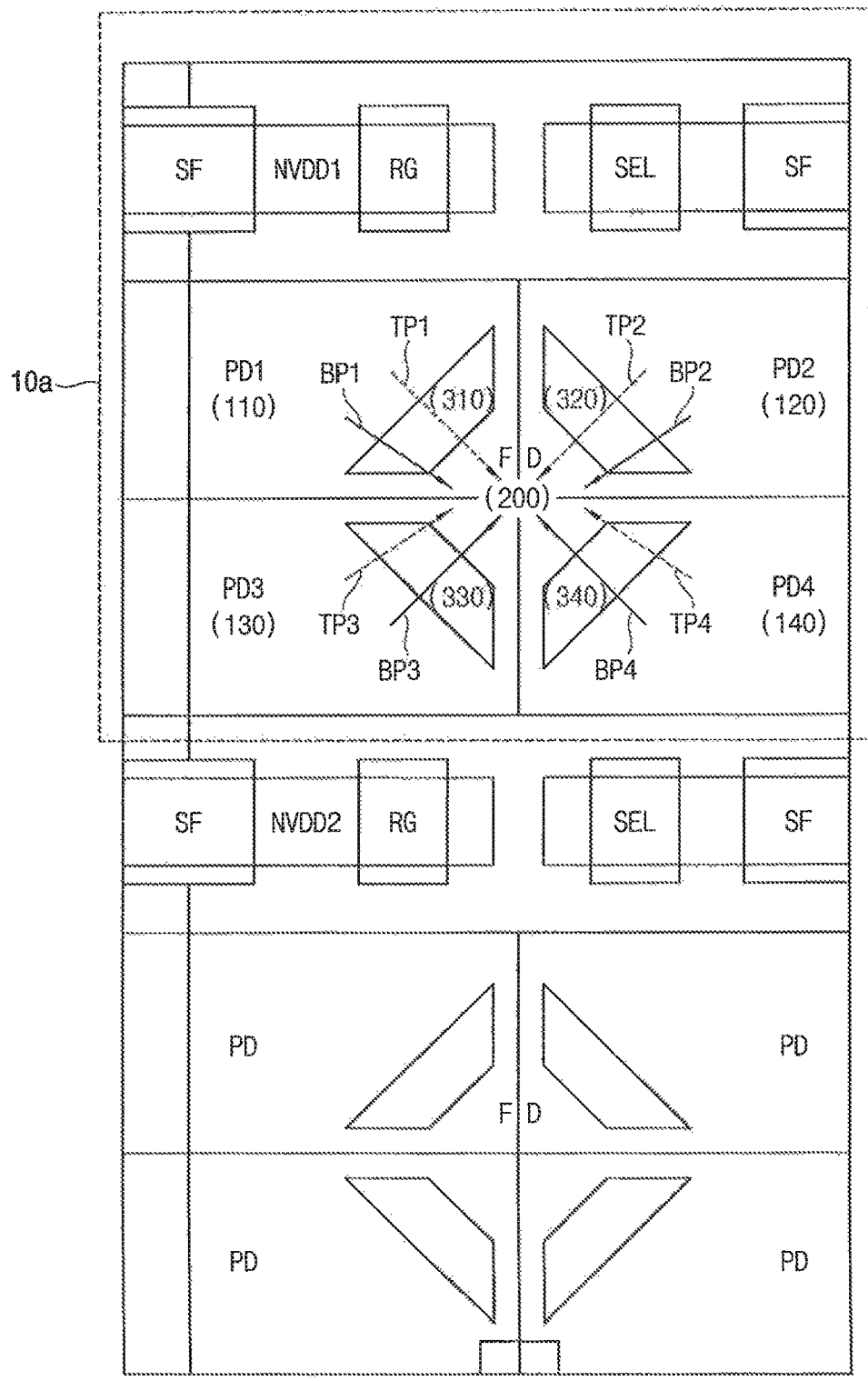
FIG. 3 is a diagram illustrating a shared pixel that does not include a blooming layer.
Figure 4:
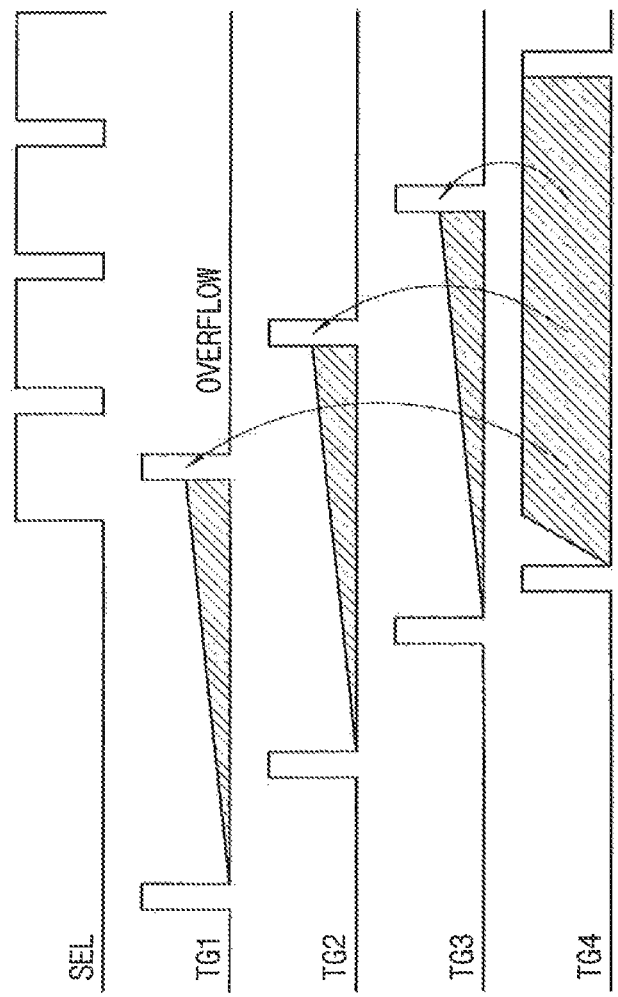
FIGS. 4 and 5 are diagrams for describing an operation of the shared pixel of FIG. 3.
Figure 5:
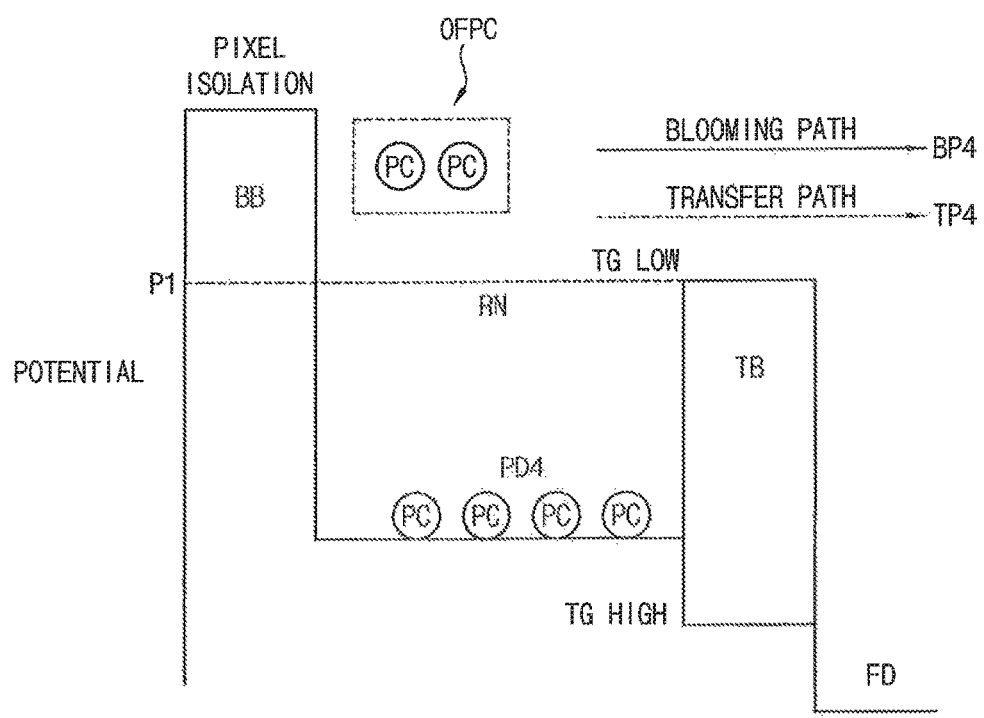

FIG. 3 is a diagram illustrating a shared pixel that does not include a blooming path and FIGS. 4 and 5 are diagrams for describing an operation of the shared pixel of FIG. 3.

Referring to FIGS. 3 to 5, a shared pixel 10a includes a plurality of photo diode regions 110 (PD1), 120 (PD2), 130 (PD3), 140 (PD4), a shared floating diffusion region 200 (FD) and a plurality of transfer gates 310, 320, 330, 340. The plurality of transfer gates 310, 320, 330, 340 may transfer the photo-charges PC to the shared floating diffusion region 200 based on a transfer control signal TG.

For example, a first logic level may be a logic high level and a second logic level may be a logic low level. When the fourth transfer control signal TG4 is the first logic level, the fourth transfer transistor TX4 may be turned-on. When the fourth transfer transistor TX4 is turned-on, the photo-charges PC stored in the fourth photo diode region 140 may be transferred to the shared floating diffusion region 200 through the fourth transfer path TP4.

In addition, the number of the photo-charges PC that are generated in the fourth photo diode region 140 may be greater than the reference photo-charge number RN. When the number of the photo-charges PC that are generated in the fourth photo diode region 140 is greater than the reference photo-charge number RN, the overflow photo-charges OFPC that are generated in the fourth photo diode region 140 may be transferred to the shared floating diffusion region 200 even though the fourth transfer control signal TG4 is the logic low level. When the shared pixel 10a generates the output signal VOUT corresponding to the photo-charges PC stored in the second photo diode region 120, if the overflow photo-charges OFPC that are generated in the fourth photo diode region 140 are transferred to the shared floating diffusion region 200, an error may be generated in the output signal VOUT corresponding to the photo-charges PC stored in the second photo diode region 120.

In this case, a direction of the fourth transfer path TP4 may be the same as a direction of the fourth blooming path BP4. The direction of the fourth transfer path TP4 and the fourth blooming path BP4 may be the direction from the fourth photo diode region 140 to the shared floating diffusion region 200.

Because the potential of a blooming barrier BB that is formed between the fourth photo diode region 140 and the power supply voltage node NVDD is greater than the potential of a transfer barrier TB that is formed between the fourth photo diode region 140 and the shared floating diffusion region 200, the blooming path may not be formed between the fourth photo diode region 140 and the power supply voltage node NVDD.

The potential corresponding to the reference photo-charge number RN may be a first potential P1. If the number of the photo-charges PC that are generated in the fourth photo diode region 140 increases, the potential corresponding to the photo-charges PC that are generated in the fourth photo diode region 140 may increase. When the potential corresponding to the photo-charges PC that are generated in the fourth photo diode region 140 is greater than the first potential P1, the overflow photo-charges OFPC of the fourth photo diode region 140 may be transferred from the fourth photo diode region 140 to the shared floating diffusion region 200. For example, the reference photo-charge number RN may be 100 and the number of the photo-charges PC that are generated in the fourth photo diode region 140 may be 150. The potential corresponding to 100 that is the reference photo-charge number RN may be the first potential P1. The number of the generated photo-charges PC of the fourth photo diode region 140 that are greater than the first potential P1 may be 50. In this case, the number of the overflow photo-charges OFPC may be 50. 50 overflow photo-charges OFPC may be transferred from the fourth photo diode region 140 to the shared floating diffusion region 200.

Figure 6:
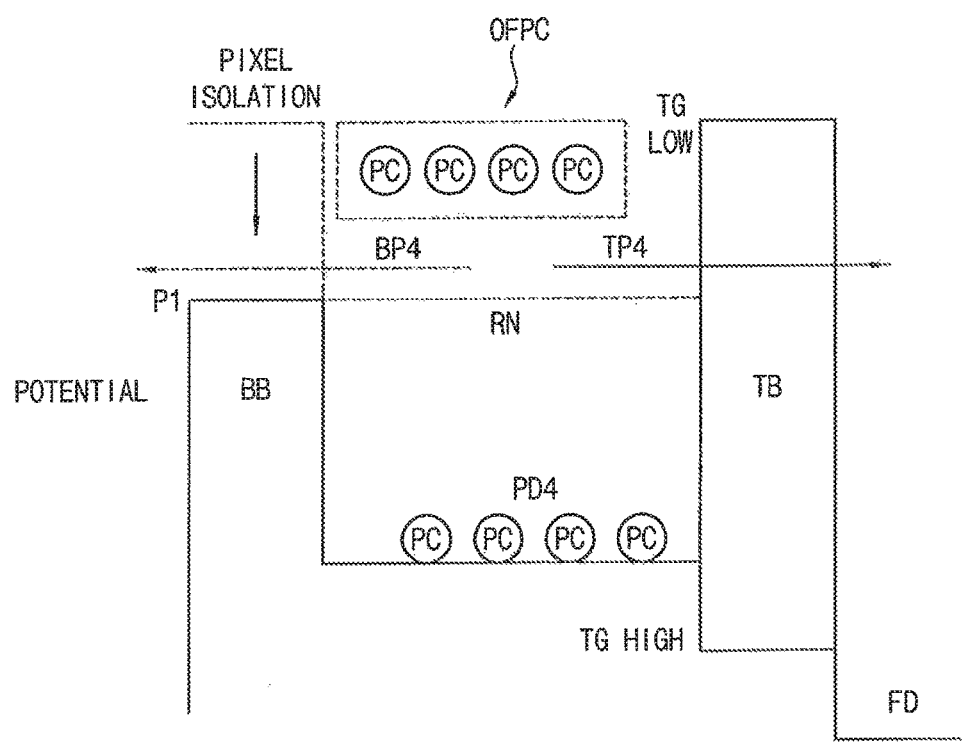
FIG. 6 is a diagram for describing an operation of the shared pixel of FIG. 1 according to an exemplary embodiment of the inventive concept.
Figure 7:
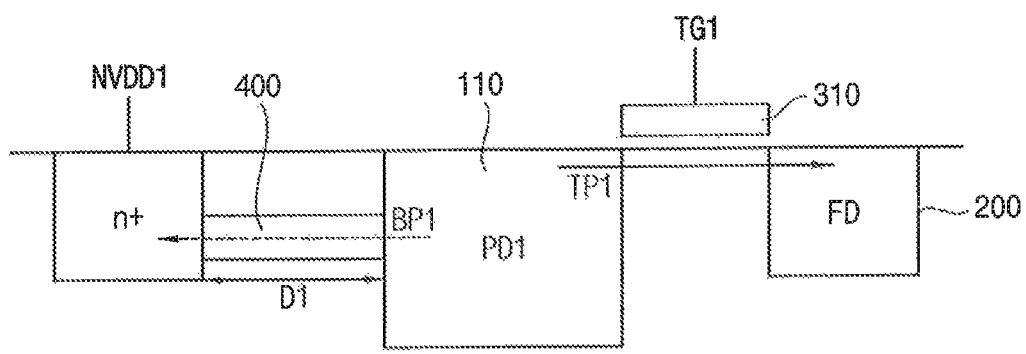
FIGS. 7 and 8 are diagrams illustrating a blooming layer included in the shared pixel of FIG. 1 according to an exemplary embodiment of the inventive concept.
Figure 8:
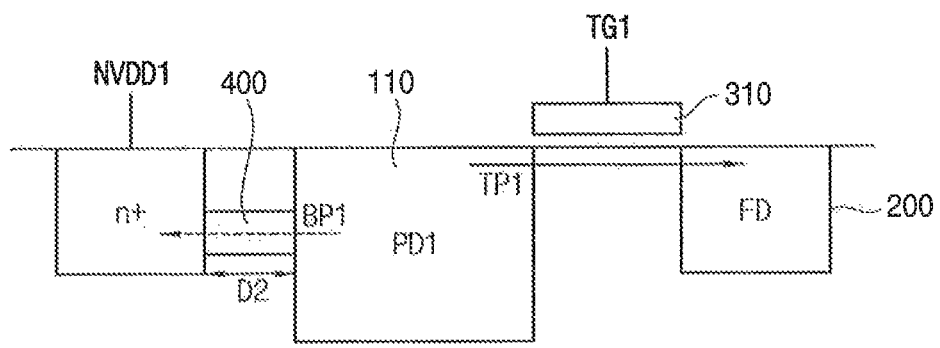
Figure 9:
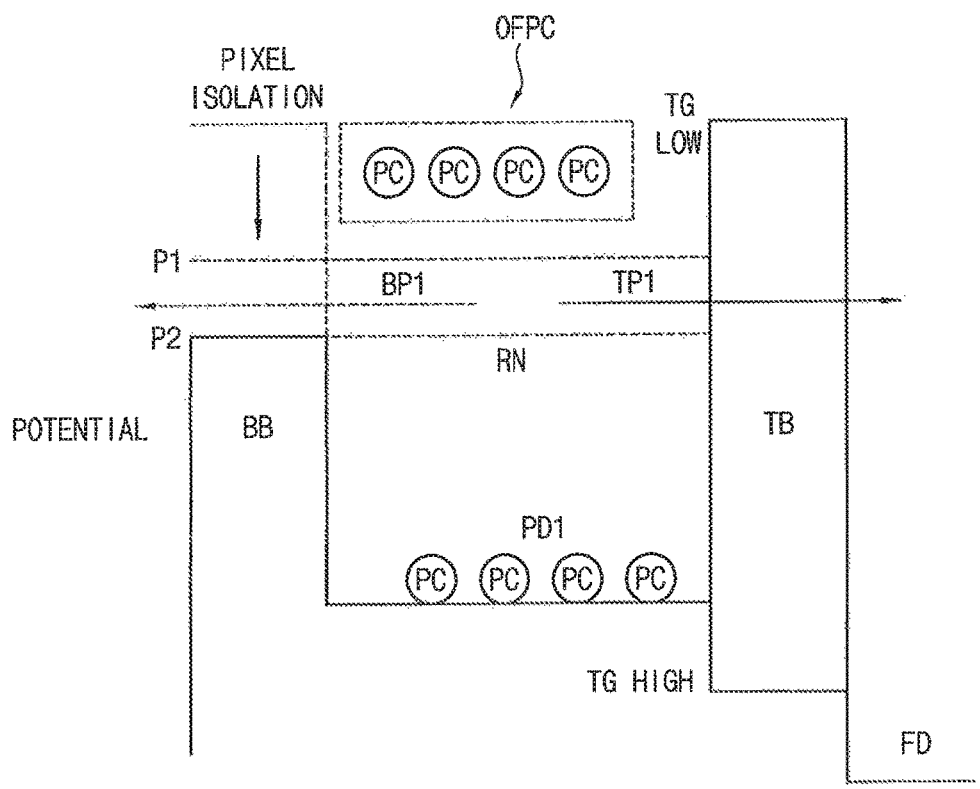
FIG. 9 is a diagram for describing a potential of a blooming barrier depending on a distance between a photo diode region and a power supply voltage node according to an exemplary embodiment of the inventive concept.

FIG. 6 is a diagram for describing an operation of the shared pixel of FIG. 1 according to an exemplary embodiment of the inventive concept. FIGS. 7 and 8 are diagrams illustrating a blooming layer included in the shared pixel of FIG. 1 according to an exemplary embodiment of the inventive concept. FIG. 9 is a diagram for describing a potential of a blooming barrier depending on a distance between a photo diode region and a power supply voltage node according to an exemplary embodiment of the inventive concept.

Referring to FIGS. 1, 6 and 7, the shared pixel 10 includes the plurality of photo diode regions 110, 120, 130, 140, the shared floating diffusion region 200, the plurality of transfer gates 310, 320, 330, 340 and the blooming layer 400. The plurality of photo diode regions 110, 120, 130, 140 generates photo-charges PC based on incident light IL. The plurality of photo diode regions 110, 120, 130, 140 is formed in the semiconductor substrate 15. The shared floating diffusion region 200 is shared among the plurality of photo diode regions 110, 120, 130, 140. The shared floating diffusion region 200 is separated from the plurality of photo diode regions 110, 120, 130, 140 in the semiconductor substrate 15. The plurality of transfer gates 310, 320, 330, 340 transfer the photo-charges PC to the shared floating diffusion region 200 based on a transfer control signal TG. The blooming layer 400 may be formed in the semiconductor substrate 15 between the active region (n+) corresponding to the power supply voltage node NVDD and the plurality of photo diode regions 110, 120, 130, 140. The blooming layer 400 transfers overflow photo-charges OFPC to a power supply voltage node NVDD where the number of the overflow photo-charges OFPC corresponds a difference between the number of the generated photo-charges PC and a reference photo-charge number RN.

In an exemplary embodiment of the inventive concept, a potential of a blooming barrier BB between each of the photo diode regions 110, 120, 130, 140 and the power supply voltage node NVDD may be less than a potential of a transfer barrier TB between each of the photo diode regions 110, 120, 130, 140 and the shared floating diffusion region 200. The potential of the blooming barrier BB may be determined based on a concentration of a material included in the blooming layer 400. For example, the potential of the blooming barrier BB may decrease as the concentration of the material included in the blooming layer 400 increases. In addition, the potential of the blooming barrier BB may increase as the concentration of the material included in the blooming layer 400 decreases.

In an exemplary embodiment of the inventive concept, the blooming layer 400 may be a well region that is formed by doping an n-type material in the semiconductor substrate 15 between the plurality of photo diode regions 110, 120, 130, 140 and the power supply voltage node NVDD. The well region may be a buried well that is formed inside the semiconductor substrate 15. For example, the n-type material may include arsenic (As) or phosphorus (P).

The plurality of transfer gates 310, 320, 330, 340 may transfer the photo-charges PC to the shared floating diffusion region 200 based on a transfer control signal TG. For example, a first logic level may be a logic high level and a second logic level may be a logic low level. When the fourth transfer control signal TG4 is the first logic level, the fourth transfer transistor TX4 may be turned-on. When the fourth transfer transistor TX4 is turned-on, the photo-charges PC stored in the fourth photo diode region 140 may be transferred to the shared floating diffusion region 200 through the fourth transfer path TP4.

In addition, the number of the photo-charges PC that are generated in the fourth photo diode region 140 may be greater than the reference photo-charge number RN. When the number of the photo-charges PC that are generated in the fourth photo diode region 140 is greater than the reference photo-charge number RN, the overflow photo-charges OFPC that are generated in the fourth photo diode region 140 may be transferred to the second power supply voltage node NVDD2 through the fourth blooming path BP4. In this case, the direction of the fourth transfer path TP4 may be different from the direction of the fourth blooming path BP4. The direction of the fourth transfer path TP4 may be the direction from the fourth photo diode region 140 to the shared floating diffusion region 200. In addition, the direction of the fourth blooming path BP4 may be the direction from the fourth photo diode region 140 to the second power supply voltage node NVDD2.

As a result, because the potential of the blooming barrier BB that is formed between the fourth photo diode region 140 and the power supply voltage node NVDD is less than the potential of the transfer barrier TB that is formed between the fourth photo diode region 140 and the shared floating diffusion region 200, the blooming path BP4 may be formed between the fourth photo diode region 140 and the second power supply voltage node NVDD2.

The potential corresponding to the reference photo-charge number RN may be the first potential P1. If the number of the photo-charges PC that are generated in the fourth photo diode region 140 increases, the potential corresponding to the photo-charges PC that are generated in the fourth photo diode region 140 may increase. When the potential corresponding to the photo-charges PC that are generated in the fourth photo diode region 140 is greater than the first potential P1, the overflow photo-charges OFPC of the fourth photo diode region 140 may be transferred from the fourth photo diode region 140 to the second power supply voltage node NVDD2. For example, the reference photo-charge number RN may be 100 and the number of the photo-charges PC that are generated in the fourth photo diode region 140 may be 150. The potential corresponding to 100 that is the reference photo-charge number RN may be the first potential P1. The number of the generated photo-charges PC of the fourth photo diode region 140 that are greater than the first potential P1 may be 50. In this case, the number of the overflow photo-charges OFPC may be 50. 50 overflow photo-charges OFPC may be transferred from the fourth photo diode region 140 to the second power supply voltage node NVDD2 through the fourth blooming path BP4.

When the blooming layer 400 is placed between the fourth photo diode region 140 and the second power supply voltage node NVDD2, the potential of the blooming barrier BB between the fourth photo diode region 140 and the second power supply voltage node NVDD2 may decrease. When the potential of the blooming barrier BB between the fourth photo diode region 140 and the second power supply voltage node NVDD2 decreases, the blooming path BP4 may be formed between the fourth photo diode region 140 and the second power supply voltage node NVDD2. When the blooming path BP4 is formed between the fourth photo diode region 140 and the second power supply voltage node NVDD2, 50 overflow photo-charges OFPC may be transferred from the fourth photo diode region 140 to the second power supply voltage node NVDD2. In this case, the overflow photo-charges OFPC of the fourth photo diode region 140 may not have an effect on adjacent pixels.

Therefore, the blooming layer 400 may be placed between the fourth photo diode region 140 and the second power supply voltage node NVDD2 to form the blooming path BP4 between the fourth photo diode region 140 and the second power supply voltage node NVDD2. The shared pixel 10 according to an exemplary embodiment of the inventive concept may increase performance by transferring the overflow photo-charges OFPC to the power supply voltage node NVDD through the blooming layer 400 that is between the photo diode regions 110, 120, 130, 140 and the power supply voltage node NVDD.

Referring to FIGS. 1, 7, 8 and 9, the shared pixel 10 includes the plurality of photo diode regions 110, 120, 130, 140, the shared floating diffusion region 200, the plurality of transfer gates 310, 320, 330, 340 and the blooming layer 400. The plurality of photo diode regions 110, 120, 130, 140 generates photo-charges PC based on incident light IL. The plurality of photo diode regions 110, 120, 130, 140 is formed in the semiconductor substrate 15. The shared floating diffusion region 200 is shared among the plurality of photo diode regions 110, 120, 130, 140. The shared floating diffusion region 200 is separated from the plurality of photo diode regions 110, 120, 130, 140 in the semiconductor substrate 15. The plurality of transfer gates 310, 320, 330, 340 transfer the photo-charges PC to the shared floating diffusion region 200 based on a transfer control signal TG. The blooming layer 400 transfers overflow photo-charges OFPC to a power supply voltage node NVDD. A number of the overflow photo-charges OFPC is a difference between a number of the generated photo-charges PC and a reference photo-charge number RN.

In an exemplary embodiment of the inventive concept, the potential of the blooming barrier BB may be determined based on a distance between each of the photo diode regions 110, 120, 130, 140 and the power supply voltage node NVDD. The potential of the blooming barrier BB may increase as the distance between the photo diode regions 110, 120, 130, 140 and the power supply voltage node NVDD increases. In addition, the potential of the blooming barrier BB may decrease as the distance between the photo diode regions 110, 120, 130, 140 and the power supply voltage node NVDD decreases.

For example, the distance between the first photo diode region 110 and the first power supply voltage node NVDD1 may be a first distance D1 in FIG. 7. In addition, the distance between the first photo diode region 110 and the first power supply voltage node NVDD1 may be a second distance D2 in FIG. 8. The first distance D1 may be greater than the second distance D2. When the first distance D1 is greater than the second distance D2, the potential of the blooming barrier BB of FIG. 7 may be the first potential P1 and the potential of the blooming barrier BB of FIG. 8 may be a second potential P2. The first potential P1 may be greater than the second potential P2. When the first distance D1 is greater than the second distance D2, the potential of the blooming barrier BB in FIG. 7 may be greater than the potential of the blooming barrier BB in FIG. 8. Therefore, the potential of the blooming barrier BB may be determined based on a distance between each of the photo diode regions 110, 120, 130, 140 and the power supply voltage node NVDD.

Figure 10:
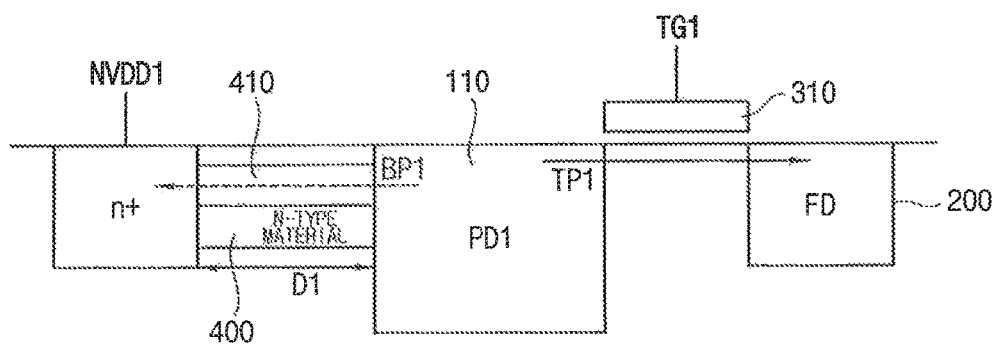
FIGS. 10 and 11 are diagrams for describing a potential of a blooming barrier when the shared pixel of FIG. 1 includes an additional blooming layer according to an exemplary embodiment of the inventive concept.
Figure 11:
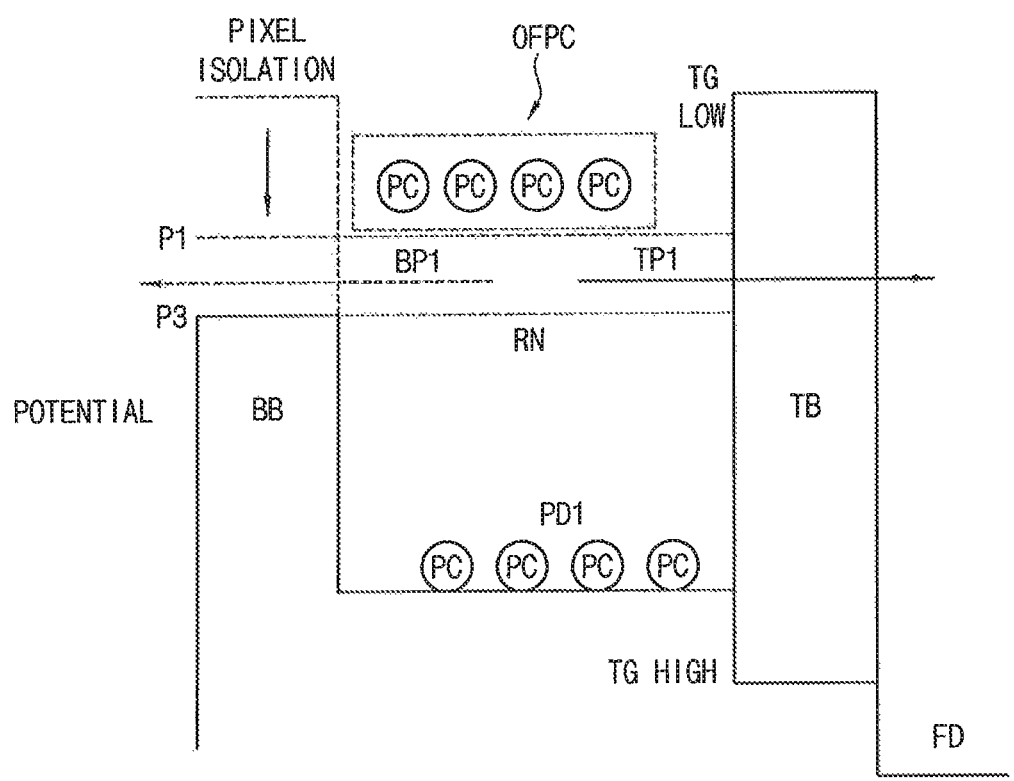

FIGS. 10 and 11 are diagrams for describing a potential of a blooming barrier BB when the shared pixel of FIG. 1 includes an additional blooming layer according to an exemplary embodiment of the inventive concept.

Referring to FIGS. 1, 7, 10 and 11, the shared pixel 10 includes the plurality of photo diode regions 110, 120, 130, 140, the shared floating diffusion region 200, the plurality of transfer gates 310, 320, 330, 340 and the blooming layer 400. The plurality of photo diode regions 110, 120, 130, 140 generates photo-charges PC based on incident light IL. The plurality of photo diode regions 110, 120, 130, 140 is formed in the semiconductor substrate 15. The shared floating diffusion region 200 is shared among the plurality of photo diode regions 110, 120, 130, 140. The shared floating diffusion region 200 is separated from the plurality of photo diode regions 110, 120, 130, 140 in the semiconductor substrate 15. The plurality of transfer gates 310, 320, 330, 340 transfer the photo-charges PC to the shared floating diffusion region 200 based on a transfer control signal TG. The blooming layer 400 transfers overflow photo-charges OFPC to a power supply voltage node NVDD. A number of the overflow photo-charges OFPC is a difference between a number of the generated photo-charges PC and a reference photo-charge number RN.

In an exemplary embodiment of the inventive concept, the shared pixel 10 may further include an additional blooming layer 410 on the blooming layer 400. When the shared pixel 10 includes the additional blooming layer 410, the potential of the blooming barrier BB may decrease. The potential of the blooming barrier BB may be determined based on a concentration of a material included in the blooming layer 400.

For example, the potential of the blooming barrier BB may decrease as the concentration of the material included in the blooming layer 400 increases. In addition, the potential of the blooming barrier BB may increase as the concentration of the material included in the blooming layer 400 decreases. The material included in the blooming layer 400 may be the n-type material. For example the n-type material may be arsenic (As) or phosphorus (P).

The potential of the blooming barrier BB of FIG. 7 may be the first potential P1 and the potential of the blooming barrier BB of FIG. 11 may be a third potential P3. The first potential P1 may be greater than the third potential P3. When the shared pixel 10 includes the additional blooming layer 410 on the blooming layer 400, the potential of the blooming barrier BB may decrease.

The plurality of transfer gates 310, 320, 330, 340 may transfer the photo-charges PC to the shared floating diffusion region 200 based on a transfer control signal TG. For example, a first logic level may be a logic high level and a second logic level may be a logic low level. When the first transfer control signal TG1 is the first logic level, the first transfer transistor TX1 may be turned-on. When the first transfer transistor TX1 is turned-on, the photo-charges PC stored in the first photo diode region 110 may be transferred to the shared floating diffusion region 200 through the first transfer path TP1.

In addition, the number of the photo-charges PC that are generated in the first photo diode region 110 may be greater than the reference photo-charge number RN. When the number of the photo-charges PC that are generated in the first photo diode region 110 is greater than the reference photo-charge number RN, the overflow photo-charges OFPC that are generated in the first photo diode region 110 may be transferred to the first power supply voltage node NVDD1 through the first blooming path BP1. In this case, the direction of the first transfer path TP1 may be different from the direction of the first blooming path BP1. The direction of the first transfer path TP1 may be the direction from the first photo diode region 110 to the shared floating diffusion region 200. In addition, the direction of the first blooming path BP1 may be the direction from the first photo diode region 110 to the first power supply voltage node NVDD1.

Because the potential of the blooming barrier BB that is formed between the first photo diode region 110 and the first power supply voltage node NVDD1 is less than the potential of the transfer barrier TB that is formed between the first photo diode region 110 and the shared floating diffusion region 200, the blooming path BP1 may be formed between the first photo diode region 110 and the first power supply voltage node NVDD1.

In FIG. 7, the potential corresponding to the reference photo-charge number RN may be the first potential P1. If the number of the photo-charges PC that are generated in the first photo diode region 110 increases, the potential corresponding to the photo-charges PC that are generated in the first photo diode region 110 may increase. When the potential corresponding to the photo-charges PC that are generated in the first photo diode region 110 is greater than the first potential P1, the overflow photo-charges OFPC of the first photo diode region 110 may be transferred from the first photo diode region 110 to the first power supply voltage node NVDD1. For example, the reference photo-charge number RN may be 100 and the number of the photo-charges PC that are generated in the first photo diode region 110 may be 150. The potential corresponding to 100 that is the reference photo-charge number RN may be the first potential P1. The number of the generated photo-charges PC of the first photo diode region 110 that are greater than the first potential P1 may be 50. In this case, the number of the overflow photo-charges OFPC may be 50. 50 overflow photo-charges OFPC may be transferred from the first photo diode region 110 to the first power supply voltage node NVDD1.

In FIG. 11, the potential corresponding to the reference photo-charge number RN may be the third potential P3. The third potential P3 may be less than the first potential P1. If the number of the photo-charges PC that are generated in the first photo diode region 110 increases, the potential corresponding to the photo-charges PC that are generated in the first photo diode region 110 may increase. When the potential corresponding to the photo-charges PC that are generated in the first photo diode region 110 is greater than the third potential P3, the overflow photo-charges OFPC of the first photo diode region 110 may be transferred from the first photo diode region 110 to the first power supply voltage node NVDD1. For example, the reference photo-charge number RN may be 70 and the number of the photo-charges PC that are generated in the first photo diode region 110 may be 150. The potential corresponding to 70 that is the reference photo-charge number RN may be the third potential P3. The number of the generated photo-charges PC of the first photo diode region 110 that are greater than the first potential P1 may be 80. In this case, the number of the overflow photo-charges OFPC may be 80. 80 overflow photo-charges OFPC may be transferred from the first photo diode region 110 to the first power supply voltage node NVDD1.

When the additional blooming layer 410 is placed between the first photo diode region 110 and the first power supply voltage node NVDD1, the potential of the blooming barrier BB between the first photo diode region 110 and the first power supply voltage node NVDD1 may further decrease. In this case, 80 overflow photo-charges OFPC may be transferred from the first photo diode region 110 to the first power supply voltage node NVDD1. Therefore, when the shared pixel 10 includes the additional blooming layer 410, the potential of the blooming barrier BB may further decrease.

Figure 12:
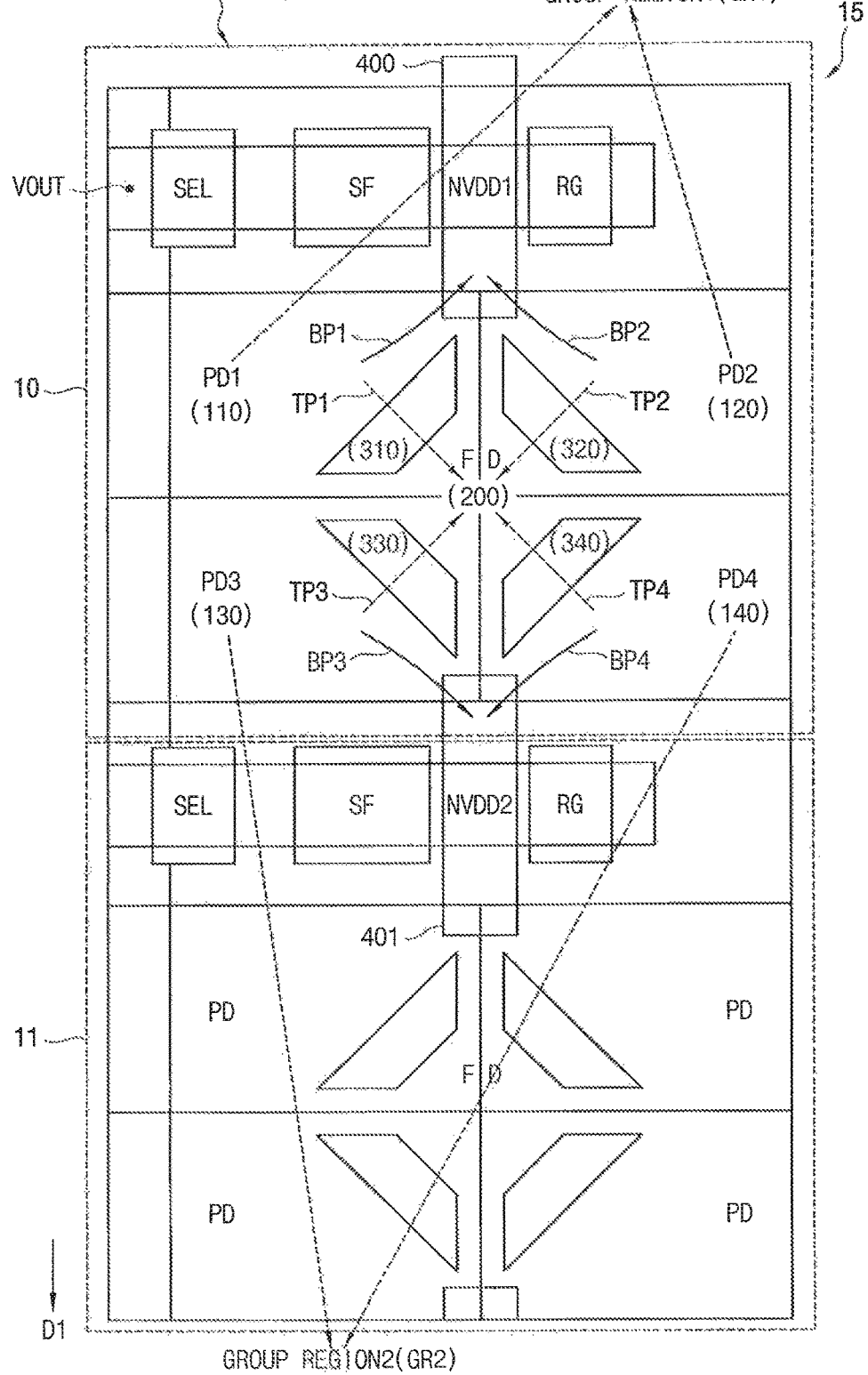
FIGS. 12 and 13 are diagrams for describing a blooming path and a transfer path in the shared pixel of FIG. 1 according to an exemplary embodiment of the inventive concept.
Figure 13:
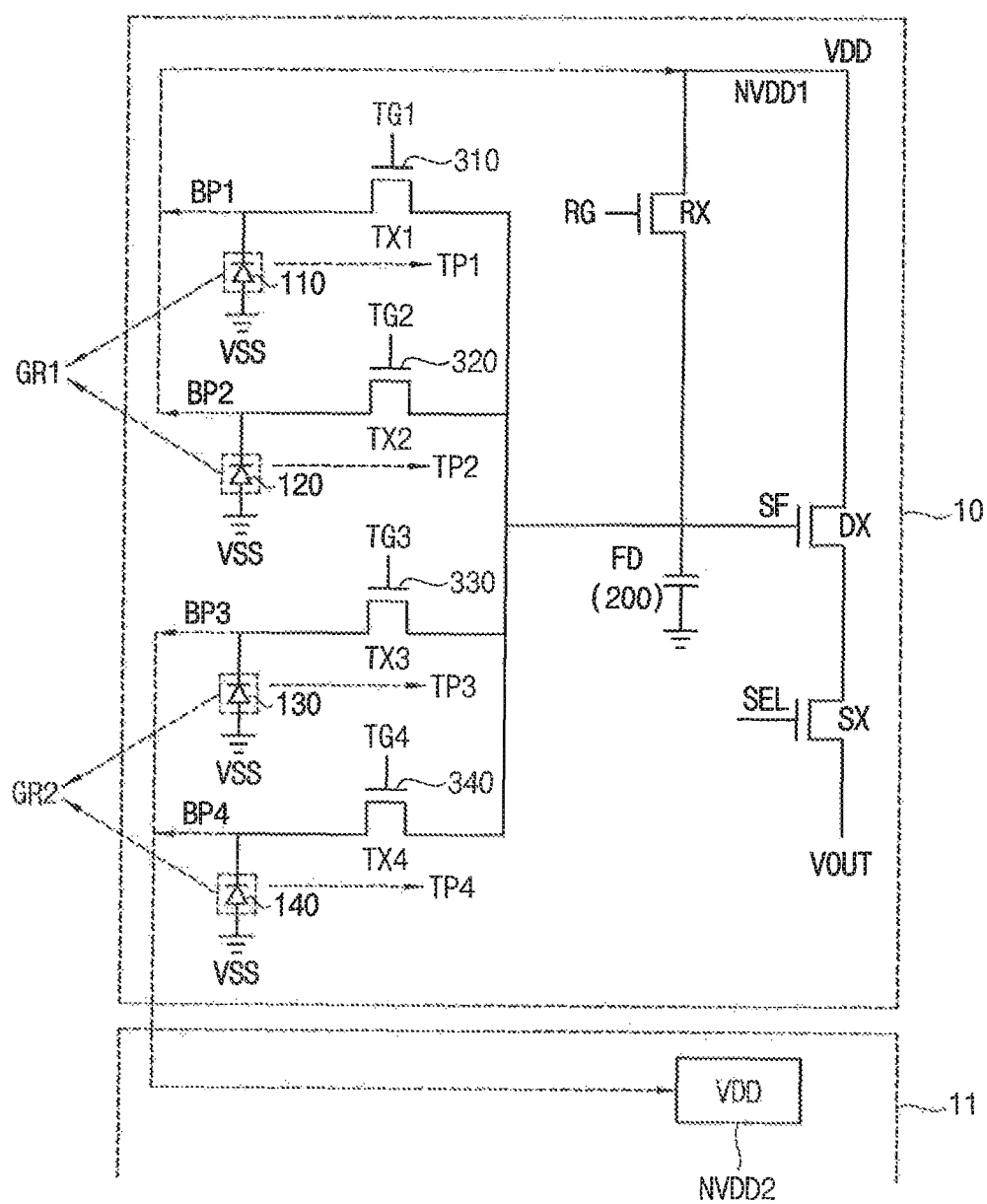

FIGS. 12 and 13 are diagrams for describing a blooming path and a transfer path in the shared pixel of FIG. 1 according to an exemplary embodiment of the inventive concept.

Referring to FIGS. 12 and 13, a shared pixel 10 includes a plurality of photo diode regions 110 (PD1), 120 (PD2), 130 (PD3), 140 (PD4), a shared floating diffusion region 200 (FD), a plurality of transfer gates 310, 320, 330, 340 and a blooming layer 400. The plurality of photo diode regions 110, 120, 130, 140 generates photo-charges PC based on incident light IL. The plurality of photo diode regions 110, 120, 130, 140 is formed in a semiconductor substrate 15.

For example, the photo diode regions 110, 120, 130, 140 may include a first photo diode region 110, a second photo diode region 120, a third photo diode region 130 and a fourth photo diode region 140. The first photo diode region 110 may correspond to a blue color, the second photo diode region 120 and the third photo diode region 130 may correspond to a green color and the fourth photo diode region 140 may correspond to a red color. The first photo diode region 110 may generate photo-charges PC corresponding to the blue color based on incident light IL. The second photo diode region 120 and the third photo diode region 130 may generate photo-charges PC corresponding to the green color based on incident light IL. In addition, the fourth photo diode region 140 may generate photo-charges PC corresponding to the red color based on incident light IL.

The shared floating diffusion region 200 is shared among the plurality of photo diode regions 110, 120, 130, 140. The shared floating diffusion region 200 is separated from the plurality of photo diode regions 110, 120, 130, 140 in the semiconductor substrate 15. The plurality of transfer gates 310, 320, 330, 340 transfer the photo-charges PC to the shared floating diffusion region 200 based on a transfer control signal TG.

For example, when a first transfer control signal TG1 is a first logic level, a first transfer transistor TX1 may be turned-on. The first logic level may be a logic high level. When the first transfer transistor TX1 is turned-on, the photo-charges PC stored in the first photo diode region 110 may be transferred to the shared floating diffusion region 200 through a first transfer path TP1. When the photo-charges PC stored in the first photo diode region 110 are transferred to the shared floating diffusion region 200 through the first transfer path TP1, a drive transistor DX may be turned-on based on a source follow signal SF. In addition, when a selection control signal SEL is the first logic level, a selection transistor SX may be turned-on. When the drive transistor DX is turned-on based on the source follow signal SF and the selection transistor SX is turned-on based on the selection control signal SEL, the shared pixel 10 may provide an output signal VOUT corresponding to the photo-charges PC stored in the first photo diode region 110.

The blooming layer 400 transfers overflow photo-charges OFPC to a power supply voltage node NVDD. The power supply voltage node NVDD may provide a power supply voltage VDD. A number of the overflow photo-charges OFPC is a difference between a number of the generated photo-charges PC and a reference photo-charge number RN. For example, the blooming layer 400 may be between the photo diode regions 110, 120, 130, 140 and the power supply voltage node NVDD. The blooming layer 400 may include a first blooming layer 400 and a second blooming layer 401.

For example, the number of the photo-charges PC that are generated in the first photo diode region 110 may be greater than the reference photo-charge number RN. When the number of the photo-charges PC that are generated in the first photo diode region 110 is greater than the reference photo-charge number RN, the overflow photo-charges OFPC that are generated in the first photo diode region 110 may be transferred to the shared floating diffusion region 200 even though the first transfer control signal TG1 is a logic low level. The number of the overflow photo-charges OFPC that are generated in the first photo diode region 110 may be the difference between the number of the photo-charges PC that are generated in the first photo diode region 110 and the reference photo-charge number RN. To prevent the overflow photo-charges OFPC of the first photo diode region 110 from being transferred to the shared floating diffusion region 200, the first blooming layer 400 may be placed between the first photo diode region 110 and the first power supply voltage node NVDD1. When the first blooming layer 400 is placed between the first photo diode region 110 and the first power supply voltage node NVDD1, the overflow photo-charges OFPC that are generated in the first photo diode region 110 may be transferred to the first power supply voltage node NVDD1 through the first blooming path BP1.

In an exemplary embodiment of the inventive concept, the overflow photo-charges OFPC that are generated in a first group region GR1 of the photo diode regions 110, 120, 130, 140 may be transferred to the first power supply voltage node NVDD1. For example, the first group region GR1 of the photo diode regions 110, 120, 130, 140 may include the first photo diode region 110 and the second photo diode region 120. The distance between the first photo diode region 110 and the first power supply voltage node NVDD1 may be less than the distance between the first photo diode region 110 and the second power supply voltage node NVDD2. In this case, the first blooming layer 400 may be placed between the first photo diode region 110 and the first power supply voltage node NVDD1. When the first blooming layer 400 is placed between the first photo diode region 110 and the first power supply voltage node NVDD1, the overflow photo-charges OFPC of the first photo diode region 110 may be transferred to the first power supply voltage node NVDD1 through the first blooming path BP1.

In addition, the distance between the second photo diode region 120 and the first power supply voltage node NVDD1 may be less than the distance between the second photo diode region 120 and the second power supply voltage node NVDD2. In this case, the first blooming layer 400 may be placed between the second photo diode region 120 and the first power supply voltage node NVDD1. When the first blooming layer 400 is placed between the second photo diode region 120 and the first power supply voltage node NVDD1, the overflow photo-charges OFPC of the second photo diode region 120 may be transferred to the first power supply voltage node NVDD1 through the second blooming path BP2.

In an exemplary embodiment of the inventive concept, the first blooming layer 400 may be formed between the first group region GR1 and the first power supply voltage node NVDD1. For example, the first group region GR1 may include the first photo diode region 110 and the second photo diode region 120. The first blooming layer 400 may be shared between the first photo diode region 110 and the second photo diode region 120.

In an exemplary embodiment of the inventive concept, the overflow photo-charges OFPC that are generated in a second group region GR2 of the photo diode regions 110, 120, 130, 140 may be transferred to a second power supply voltage node NVDD2 that is different from the first power supply voltage node NVDD1. For example, the second group region GR2 of the photo diode regions 110, 120, 130, 140 may include the third photo diode region 130 and the fourth photo diode region 140. The distance between the third photo diode region 130 and the second power supply voltage node NVDD2 may be less than the distance between the third photo diode region 130 and the first power supply voltage node NVDD1. In this case, the second blooming layer 401 may be placed between the third photo diode region 130 and the second power supply voltage node NVDD2. When the second blooming layer 401 is placed between the third photo diode region 130 and the second power supply voltage node NVDD2, the overflow photo-charges OFPC of the third photo diode region 130 may be transferred to the second power supply voltage node NVDD2 through the third blooming path BP3.

The distance between the fourth photo diode region 140 and the second power supply voltage node NVDD2 may be less than the distance between the fourth photo diode region 140 and the first power supply voltage node NVDD1. In this case, the second blooming layer 401 may be placed between the fourth photo diode region 140 and the second power supply voltage node NVDD2. When the second blooming layer 401 is placed between the fourth photo diode region 140 and the second power supply voltage node NVDD2, the overflow photo-charges OFPC of the fourth photo diode region 140 may be transferred to the second power supply voltage node NVDD2 through the fourth blooming path BP4.

In an exemplary embodiment of the inventive concept, the second blooming layer 401 may be formed between the second group region GR2 and the second power supply voltage node NVDD2. For example, the second group region GR2 may include the third photo diode region 130 and the fourth photo diode region 140. The second blooming layer 401 may be shared between the third photo diode region 130 and the fourth photo diode region 140.

In an exemplary embodiment of the inventive concept, the second power supply voltage node NVDD2 may be included in another shared pixel 11 adjacent to the shared pixel 10. For example, the adjacent shared pixel 11 may be placed along the first direction D1 from the shared pixel 10. The adjacent shared pixel 11 may include the second power supply voltage node NVDD2. The overflow photo-charges OFPC that are generated in the second group region GR2 of the photo diode regions 110, 120, 130, 140 may be transferred to the second power supply voltage node NVDD2 that is different from the first power supply voltage node NVDD1.

In an exemplary embodiment of the inventive concept, a number of the photo diode regions 110, 120, 130, 140 included in the shared pixel 10 may be 4.

Figure 14:
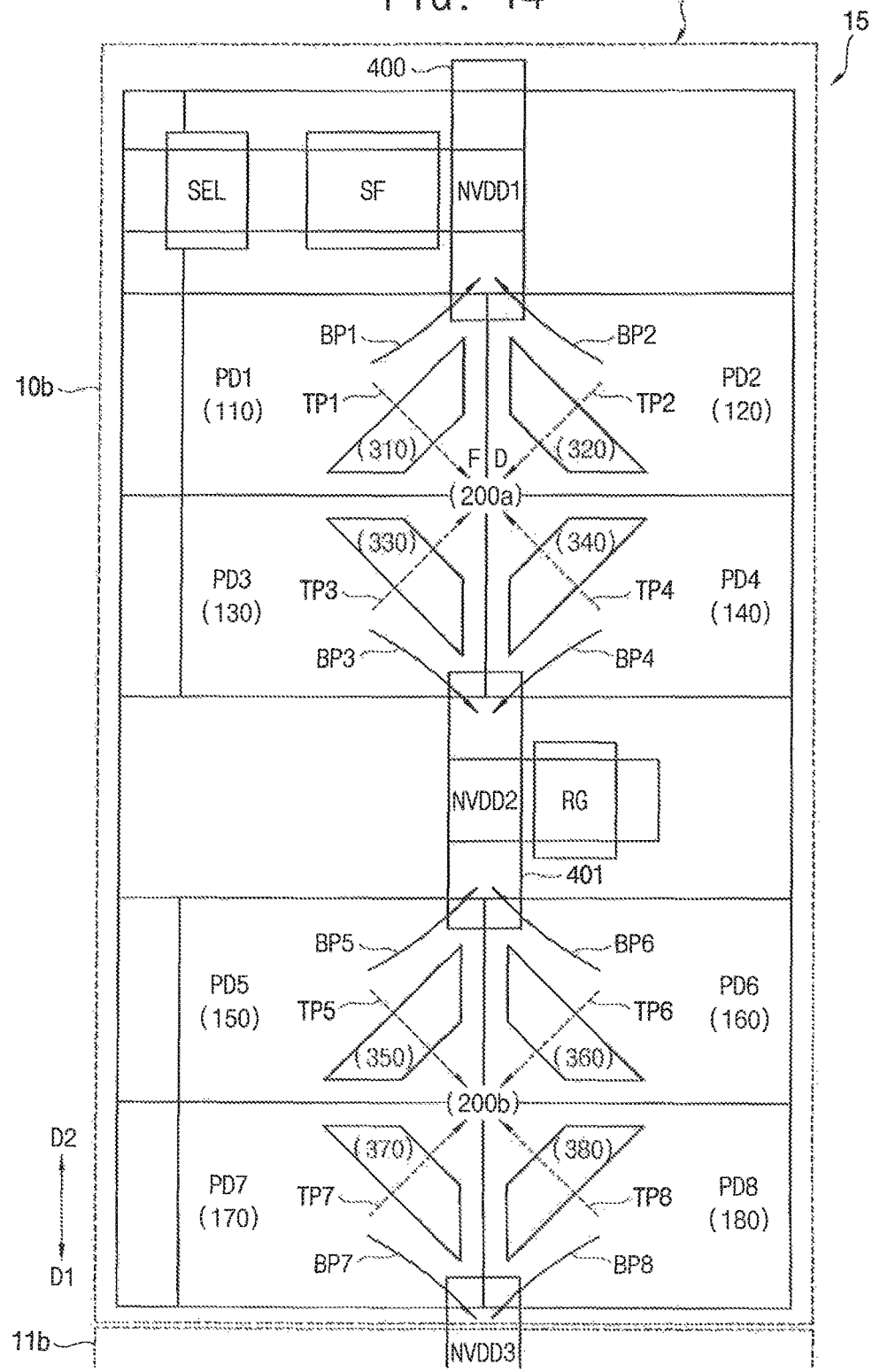
FIG. 14 is a diagram illustrating a shared pixel according to an exemplary embodiment of the inventive concept.

FIG. 14 is a diagram illustrating a shared pixel according to an exemplary embodiment of the inventive concept.

Referring to FIG. 14, a shared pixel 10b includes a plurality of photo diode regions 110 (PD1), 120 (PD2), 130 (PD3), 140 (PD4), 150 (PD5), 160 (PD6), 170 (PD7), 180 (PD8), shared floating diffusion regions 200a (FD), 200b, a plurality of transfer gates 310, 320, 330, 340, 350, 360, 370, 380 and blooming layers 400, 401. The plurality of photo diode regions 110, 120, . . . , 180 generates photo-charges PC based on incident light IL. The plurality of photo diode regions 110, 120, . . . , 180 is formed in a semiconductor substrate 15. The shared floating diffusion region 200a, 200b is shared among the plurality of photo diode regions 110, 120, . . . , 180. The shared floating diffusion regions 200a, 200b are separated from the plurality of photo diode regions 110, 120, . . . , 180 in the semiconductor substrate 15. The plurality of transfer gates 310, 320, . . . , 380 transfer the photo-charges PC to the shared floating diffusion regions 200a, 200b based on a transfer control signal TG. The blooming layers 400, 401 transfer overflow photo-charges OFPC to a power supply voltage node NVDD. A number of the overflow photo-charges OFPC is a difference between a number of the generated photo-charges PC and a reference photo-charge number RN.

For example, the number of the photo diode regions 110, 120, ..., 180 included in the shared pixel 10b may be 8. The shared floating diffusion region 200b that is placed along the first direction D1 from a second power supply voltage node NVDD2 may be connected to the shared floating diffusion region 200a that is placed along the second direction D2 from the second power supply voltage node NVDD2 with an electric wire. The photo-charges PC stored in the first photo diode region 110 may be transferred to the shared floating diffusion region 200a through a first transfer path TP1 based on a first transfer control signal TG1, and the overflow photo-charges OFPC that are generated in the first photo diode region 110 may be transferred to a first power supply voltage node NVDD1 through a first blooming path BP1. In addition, the photo-charges PC stored in the second photo diode region 120 may be transferred to the shared floating diffusion region 200a through a second transfer path TP2 based on a second transfer control signal TG2, and the overflow photo-charges OFPC that are generated in the second photo diode region 120 may be transferred to the first power supply voltage node NVDD1 through a second blooming path BP2.

The photo-charges PC stored in the third photo diode region 130 may be transferred to the shared floating diffusion region 200a through a third transfer path TP3 based on a third transfer control signal TG3, and the overflow photo-charges OFPC that are generated in the third photo diode region 130 may be transferred to the second power supply voltage node NVDD2 through a third blooming path BP3. In addition, the photo-charges PC stored in the fourth photo diode region 140 may be transferred to the shared floating diffusion region 200a through a fourth transfer path TP4 based on a fourth transfer control signal TG4, and the overflow photo-charges OFPC that are generated in the fourth photo diode region 140 may be transferred to the second power supply voltage node NVDD2 through a fourth blooming path BP4.

The photo-charges PC stored in the fifth photo diode region 150 may be transferred to the shared floating diffusion region 200b through a fifth transfer path TP5 based on a fifth transfer control signal TG5, and the overflow photo-charges OFPC that are generated in the fifth photo diode region 150 may be transferred to the second power supply voltage node NVDD2 through a fifth blooming path BP5. In addition, the photo-charges PC stored in the sixth photo diode region 160 may be transferred to the shared floating diffusion region 200b through a sixth transfer path TP6 based on a sixth transfer control signal TG6, and the overflow photo-charges OFPC that are generated in the sixth photo diode region 160 may be transferred to the second power supply voltage node NVDD2 through a sixth blooming path BP6.

The photo-charges PC stored in the seventh photo diode region 170 may be transferred to the shared floating diffusion region 200b through a seventh transfer path TP7 based on a seventh transfer control signal TG7, and the overflow photo-charges OFPC that are generated in the seventh photo diode region 170 may be transferred to a third power supply voltage node NVDD3 through a seventh blooming path BP7. In addition, the photo-charges PC stored in the eighth photo diode region 180 may be transferred to the shared floating diffusion region 200b through an eighth transfer path TP8 based on an eighth transfer control signal TG8, and the overflow photo-charges OFPC that are generated in the eighth photo diode region 180 may be transferred to the third power supply voltage node NVDD3 through the eighth blooming path BP8.

The shared pixel 10b according to an exemplary embodiment of the inventive concept may increase performance by transferring the overflow photo-charges OFPC to the power supply voltage node NVDD through the blooming layer 400, 401 that is between the photo diode regions 110, 120, ..., 180 and the power supply voltage node NVDD.

Figure 15:
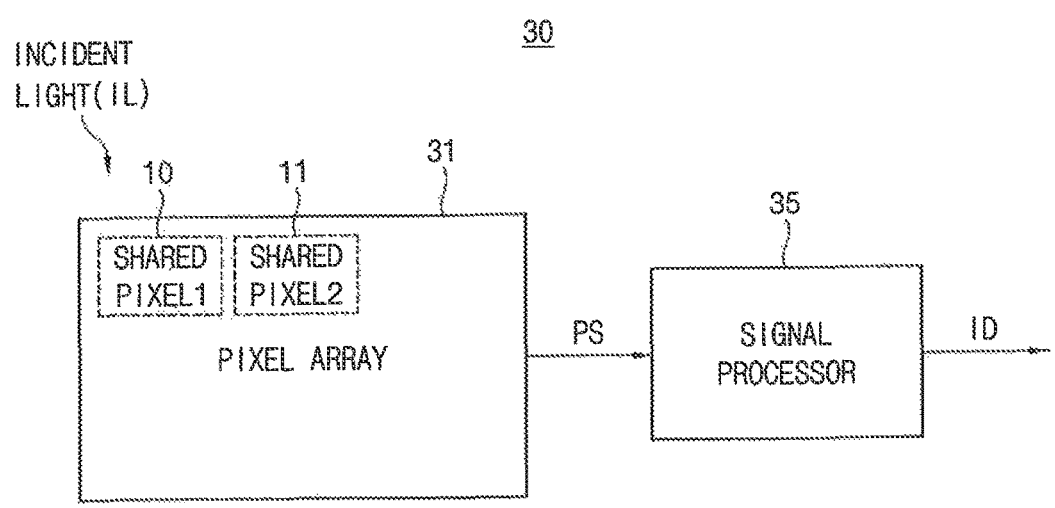
FIG. 15 is a diagram illustrating an image sensor according to an exemplary embodiment of the inventive concept.
Figure 16:
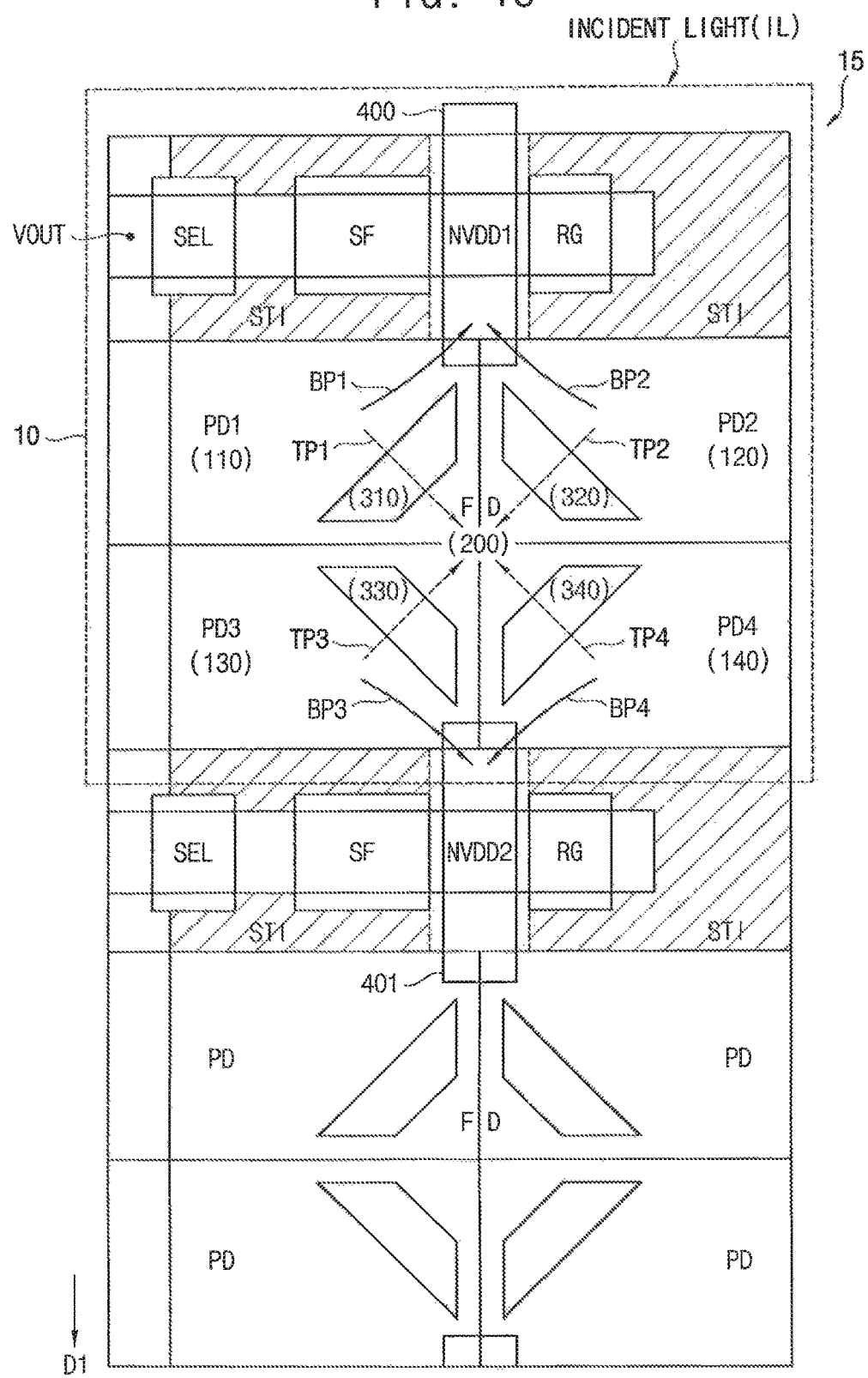
FIG. 16 is a diagram illustrating a shared pixel that is implemented by a partial shallow trench isolation process according to an exemplary embodiment of the inventive concept.

FIG. 15 is a diagram illustrating an image sensor according to an exemplary embodiment of the inventive concept. FIG. 16 is a diagram illustrating a shared pixel that is implemented by a partial shallow trench isolation process according to an exemplary embodiment of the inventive concept.

Referring to FIGS. 1, 2, 15 and 16, an image sensor 30 includes a pixel array 31 and a signal processor 35. The pixel array 31 generates a plurality of pixel signals PS based on incident light IL. The pixel array 31 includes a plurality of shared pixels 10, 11. The signal processor 35 generates image data ID based on the pixel signals PS.

Each of the shared pixels 10, 11 includes a plurality of photo diode regions 110 (PD1), 120 (PD2), 130 (PD3), 140 (PD4), a shared floating diffusion region 200 (FD), a plurality of transfer gates 310, 320, 330, 340 and a blooming layer 400. The plurality of photo diode regions 110, 120, 130, 140 generates photo-charges PC based on incident light IL. The plurality of photo diode regions 110, 120, 130, 140 is formed in a semiconductor substrate 15. The shared floating diffusion region 200 is shared among the plurality of photo diode regions 110, 120, 130, 140. The shared floating diffusion region 200 is separated from the plurality of photo diode regions 110, 120, 130, 140 in the semiconductor substrate 15.

The plurality of transfer gates 310, 320, 330, 340 transfer the photo-charges PC to the shared floating diffusion region 200 based on a transfer control signal TG. The blooming layer 400 transfers overflow photo-charges OFPC to a power supply voltage node NVDD. A number of the overflow photo-charges OFPC is a difference between a number of the generated photo-charges PC and a reference photo-charge number RN.

A potential of a blooming barrier BB between each of the photo diode regions 110, 120, 130, 140 and the power supply voltage node NVDD may be less than a potential of a transfer barrier TB between each of the photo diode regions 110, 120, 130, 140 and the shared floating diffusion region 200. The potential of the blooming barrier BB may be determined based on a concentration of an n-type material included in the blooming layer 400. The shared pixel 10 according to the present exemplary embodiment may increase performance by transferring the overflow photo-charges OFPC to the power supply voltage node NVDD through the blooming layer 400 that is between the photo diode regions 110, 120, 130, 140 and the power supply voltage node NVDD.

In an exemplary embodiment of the inventive concept, the shared pixel 10 may be implemented by a shallow trench isolation free (STI-free) process. In other words, the shared pixel 10 may not include the shallow trench isolation STI structure in the sensing regions in which the photo diode regions and the floating diffusion regions are formed and the read circuit region in which the transistors RX, DX and SX are formed.

In an exemplary embodiment of the inventive concept, as illustrated in FIG. 16, the shared pixel 10 may be implemented by a partial shallow trench isolation free (partial STI-free) process. In other words, the sensing region may not include the shallow trench isolation STI structure and the read circuit region may include the shallow trench isolation STI structure.

Figure 17:
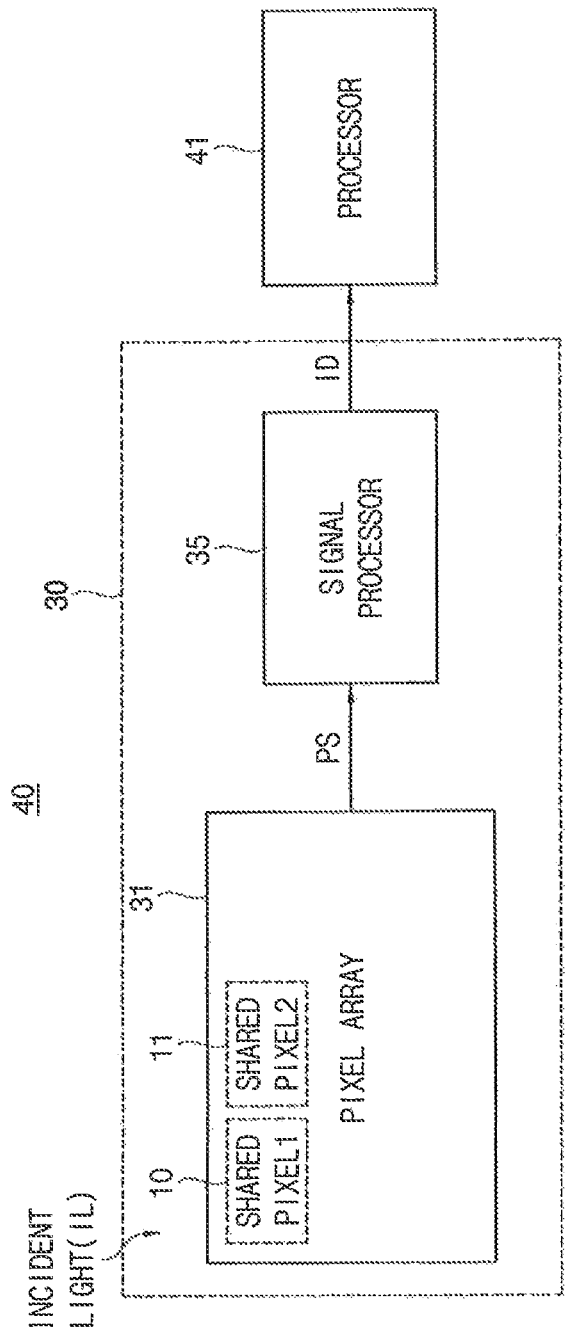
FIG. 17 a diagram illustrating a computing system according to an exemplary embodiment of the inventive concept.

FIG. 17 a diagram illustrating a computing system according to an exemplary embodiment of the inventive concept.

Referring to FIG. 17, a computing system 40 includes an image sensor 30 and a processor 41. The image sensor 30 includes the shared pixels 10, 11 and generates the image data ID. The processor 41 processes the image data ID. The image sensor 30 includes a pixel array 31 and a signal processor 35. The pixel array 31 generates a plurality of pixel signals PS based on incident light IL. The pixel array 31 includes the shared pixels 10, 11. The signal processor 35 generates image data ID based on the pixel signals PS.

In reference to exemplary embodiments of the inventive concept described above, each of the shared pixels 10, 11 includes a plurality of photo diode regions 110, 120, 130, 140, a shared floating diffusion region 200, a plurality of transfer gates 310, 320, 330, 340 and a blooming layer 400. The plurality of photo diode regions 110, 120, 130, 140 generates photo-charges PC based on incident light IL. The plurality of photo diode regions 110, 120, 130, 140 is formed in a semiconductor substrate 15. The shared floating diffusion region 200 is shared among the plurality of photo diode regions 110, 120, 130, 140. The shared floating diffusion region 200 is separated from the plurality of photo diode regions 110, 120, 130, 140 in the semiconductor substrate 15.

The plurality of transfer gates 310, 320, 330, 340 transfer the photo-charges PC to the shared floating diffusion region 200 based on a transfer control signal TG. The blooming layer 400 transfers overflow photo-charges OFPC to a power supply voltage node NVDD. A number of the overflow photo-charges OFPC is a difference between a number of the generated photo-charges PC and a reference photo-charge number RN.

The shared pixels 10, 11 according to an exemplary embodiment of the inventive concept may increase performance by transferring the overflow photo-charges OFPC to the power supply voltage node NVDD through the blooming layer 400 that is between the photo diode regions 110, 120, 130, 140 and the power supply voltage node NVDD.

Figure 18:
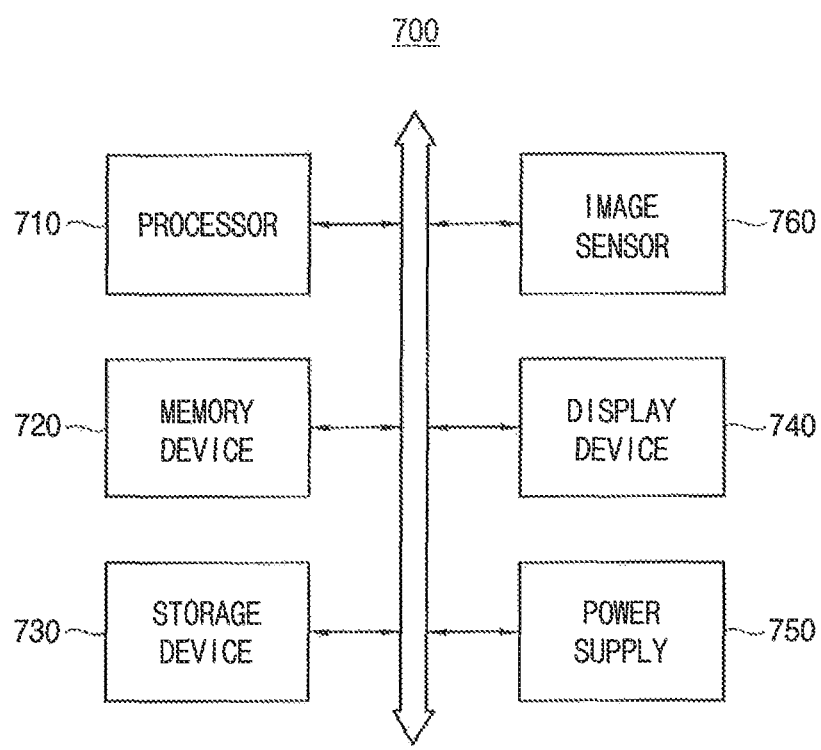
FIG. 18 is a block diagram illustrating a mobile device including an image sensor according to an exemplary embodiment of the inventive concept.

FIG. 18 is a block diagram illustrating a mobile device including a memory module according to an exemplary embodiment of the inventive concept.

Referring to FIG. 18, a mobile device 700 may include a processor 710, a memory device 720, a storage device 730, a display device 740, a power supply 750 and an image sensor 760. The mobile device 700 may further include ports that communicate with a video card, a sound card, a memory card, a universal serial bus (USB) device, other electronic devices, etc.

The processor 710 may perform various calculations or tasks. According to an exemplary embodiment of the inventive concept, the processor 710 may be a microprocessor or a central processing unit (CPU). The processor 710 may communicate with the memory device 720, the storage device 730, and the display device 740 via an address bus, a control bus, and/or a data bus. In an exemplary embodiment of the inventive concept, the processor 710 may be coupled to an extended bus, such as a peripheral component interconnection (PCI) bus. The memory device 720 may store data for operating the mobile device 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 may include a data loading circuit. The storage device 730 may include a solid state drive (SSD), a hard disk drive (HDD), a compact disk read only memory (CD-ROM), etc. The mobile device 700 may further include an input device such as a touchscreen, a keyboard, a keypad, a mouse, etc., and an output device such as a printer, a display device, etc. The power supply 750 supplies operation voltages for the mobile device 700.

The image sensor 760 may communicate with the processor 710 via the buses or other communication links. The image sensor 760 may be integrated with the processor 710 in one chip, or the image sensor 760 and the processor 710 may be implemented as separate chips. The image sensor 760 may include the shared pixel according to an exemplary embodiment of the inventive concept. The shared pixel may increase the performance of the image sensor 760 by transferring the overflow photo-charges OFPC to the power supply voltage node NVDD through the blooming layer 400 that is between the photo diode regions 110, 120, 130, 140 and the power supply voltage node NVDD.

At least a portion of the mobile device 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP). The mobile device 700 may be a digital camera, a mobile phone, a smart phone, a portable multimedia player (PMP), a personal digital assistant (PDA), a computer, etc.

FIG. 19 is a block diagram illustrating a computing system including a memory system according to an exemplary embodiment of the inventive concept.

Referring to FIG. 19, a computing system 1100 may employ or support a mobile industry processor interface (MIPI) interface, and may include an application processor 1110, an image sensor 1140 (e.g., a camera), and a display device 1150. A CSI host 1112 of the application processor 1110 may perform a serial communication with a CSI device 1141 of the image sensor 1140 using a camera serial interface (CSI). In an exemplary embodiment of the inventive concept, the CSI host 1112 may include a deserializer DES, and the CSI device 1141 may include a serializer SER. A DSI host 1111 of the application processor 1110 may perform a serial communication with a DSI device 1151 of the display device 1150 using a display serial interface (DSI).

The image sensor 1140 may include the shared pixel according to an exemplary embodiment of the inventive concept. The shared pixel may increase performance of the image sensor 1140 by transferring the overflow photo-charges OFPC to the power supply voltage node NVDD through the blooming layer 400 that is between the photo diode regions 110, 120, 130, 140 and the power supply voltage node NVDD.

In an exemplary embodiment of the inventive concept, the DSI host 1111 may include a serializer SER, and the DSI device 1151 may include a deserializer DES. The computing system 1100 may further include a radio frequency (RF) chip 1160. A physical interface (PHY) 1113 of the application processor 1110 may perform data transfer with a PHY 1161 of the RF chip 1160 using a MIPI DigRF. The application processor 1110 may include a DigRF MASTER 1114 for controlling the data transfer with the PHY 1161 of the RF chip 1160.

The computing system 1100 may further include a global positioning system (GPS) unit 1120, a storage device 1170, a microphone 1180, a DRAM 1185, and a speaker 1190. The computing system 1100 may communicate with external devices using an ultra-wideband (UWB) communication 1210, a wireless local area network (WLAN) communication 1220, a worldwide interoperability for microwave access (WIMAX) communication 1230, etc. Exemplary embodiments of the inventive concept may not be limited to the configurations or interfaces of the computing system 1100 illustrated in FIG. 19.

Exemplary embodiments of the present inventive concept may be applied to a variety of devices and systems including an image sensor. For example, exemplary embodiments of the present inventive concept may be applied to systems such as a mobile phone, a smart phone, a PDA, a PMP, a digital camera, a camcorder, a personal computer (PC), a server computer, a workstation, a laptop computer, a digital television (TV), a set-top box, a portable game console, a navigation system, etc.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A shared pixel, comprising:
   a plurality of photo diode regions each configured to generate photo-charges in response to incident light, wherein the plurality of photo diode regions are formed in a semiconductor substrate;
   a shared floating diffusion region that is shared by the plurality of photo diode regions, wherein the shared floating diffusion region is separated from the plurality of photo diode regions in the semiconductor substrate;
   a plurality of transfer gates each configured to transfer the photo-charges of a corresponding photo diode region to the shared floating diffusion region in response to a transfer control signal;
   a first blooming layer configured to transfer overflow photo-charges to a power supply voltage node, wherein a number of the overflow photo-charges is a difference between a number of the photo-charges generated by one of the photo diode regions and a reference photo-charge number; and
   a second blooming layer formed on the first blooming layer,
   wherein a potential of a blooming barrier between one of the photo diode regions and the power supply voltage node is decreased by the second blooming layer.

2. The shared pixel of claim 1, wherein the potential of the blooming barrier is less than a potential of a transfer barrier between the one of the photo diode regions and the shared floating diffusion region.

3. The shared pixel of claim 2, wherein the potential of the blooming barrier is based on a material included in the first blooming layer.

4. The shared pixel of claim 3, wherein the first blooming layer includes a well region that is doped with an n-type material in the semiconductor substrate between the plurality of photo diode regions and the power supply voltage node, and the n-type material includes arsenic (As) or phosphorus (P).

5. The shared pixel of claim 2, wherein the potential of the blooming barrier is based on a distance between the one of the photo diode regions and the power supply voltage node.

6. The shared pixel of claim 1, wherein the overflow photo-charges that are generated in a first group region of the photo diode regions are transferred to a first power supply voltage node, and
   wherein the first blooming layer is formed between the first group region and the first power supply voltage node.

7. The shared pixel of claim 6, wherein the overflow photo-charges that are generated in a second group region of the photo diode regions are transferred to a second power supply voltage node that is different from the first power supply voltage node, and
   wherein a third blooming layer is formed between the second group region and the second power supply voltage node.

8. The shared pixel of claim 7, wherein the second power supply voltage node is included in another shared pixel adjacent to the shared pixel.

9. The shared pixel of claim 1, wherein the shared pixel includes four or eight photo diode regions.

10. The shared pixel of claim 1, wherein the shared pixel includes a shallow trench isolation free (STI-free) structure.

11. The shared pixel of claim 1, wherein the shared pixel includes a partial shallow trench isolation free (partial STI-free) structure.

12. An image sensor, comprising:
    a pixel array configured to generate a plurality of pixel signals in response to incident light, the pixel array including a plurality of shared pixels; and
    a signal processor configured to generate image data in response to the pixel signals,
    at least one of the shared pixels comprising:
    a plurality of photo diode regions each configured to generate photo-charges in response to the incident light, wherein the plurality of photo diode regions are formed in a semiconductor substrate;
    a shared floating diffusion region that is shared by the plurality of photo diode regions, wherein the shared floating diffusion region is separated from the plurality of photo diode regions in the semiconductor substrate;
    a plurality of transfer gates each configured to transfer the photo-charges to the shared floating diffusion region in response to a transfer control signal;
    a first blooming layer configured to transfer overflow photo-charges to a power supply voltage node, wherein a number of the overflow photo-charges is a difference between a number of the photo-charges generated by one of the photo diode regions and a reference photo-charge number; and
    a second blooming layer on the first blooming layer.

13. The image sensor of claim 12, wherein a potential of a blooming barrier between one of the photo diode regions and the power supply voltage node is less than a potential of a transfer barrier between the one of the photo diode regions and the shared floating diffusion region.

14. The image sensor of claim 13, wherein the potential of the blooming barrier is based on a material included in the first blooming layer.

15. A pixel, comprising:
a plurality of photo diodes;
a floating diffusion region;
a plurality of transfer gates configured to transfer photo charges of the photo diodes to the floating diffusion region; and
a multi-layered blooming layer configured to transfer overflow photo charges to a power supply voltage node.

16. The pixel of claim 15, wherein a first transfer transistor transfers photo charges of a first photo diode to the floating diffusion region via a first transfer path and overflow photo charges of the first photo diode are transferred to the power supply voltage node via a first blooming path.

17. The pixel of claim 16, wherein the power supply voltage node is connected between the first transfer transistor and a drive transistor.

18. The pixel of claim 15, wherein the power supply voltage node includes a n+ material.

19. The pixel of claim 15, wherein the floating diffusion region is separated from the photo diodes in a semiconductor substrate.

* * * * *